(12) United States Patent
Tanaka et al.

(10) Patent No.: US 8,470,509 B2
(45) Date of Patent: *Jun. 25, 2013

(54) NEGATIVE RESIST COMPOSITION AND PATTERNING PROCESS

(75) Inventors: Akinobu Tanaka, Jyoetsu (JP); Keiichi Masunaga, Jyoetsu (JP); Daisuke Domon, Jyoetsu (JP); Satoshi Watanabe, Jyoetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 165 days.

This patent is subject to a terminal disclaimer.

(21) Appl. No.: 12/902,868

(22) Filed: Oct. 12, 2010

(65) Prior Publication Data

US 2011/0129765 A1    Jun. 2, 2011

(30) Foreign Application Priority Data

Dec. 1, 2009  (JP) .................................. 2009-273683

(51) Int. Cl.
  *G03F 7/004* (2006.01)
  *G03F 7/028* (2006.01)
  *G03F 7/038* (2006.01)
  *G03F 7/26* (2006.01)

(52) U.S. Cl.
  USPC ......... 430/270.1; 430/325; 430/921; 430/927

(58) Field of Classification Search
  USPC .................. 430/270.1, 325, 434, 927, 921
  See application file for complete search history.

(56) References Cited

U.S. PATENT DOCUMENTS

| | | | |
|---|---|---|---|
| 6,902,862 B2 * | 6/2005 | Takahashi et al. ......... 430/270.1 |
| 8,168,367 B2 | 5/2012 | Watanabe et al. |
| 2003/0022095 A1 | 1/2003 | Kai et al. |
| 2006/0166133 A1 | 7/2006 | Koitabashi et al. |
| 2006/0204891 A1 | 9/2006 | Hatakeyama |
| 2006/0281023 A1 | 12/2006 | Hirosaki et al. |
| 2007/0212619 A1 | 9/2007 | Yoshikawa et al. |
| 2008/0020290 A1 * | 1/2008 | Hatakeyama et al. ............ 430/4 |
| 2008/0079169 A1 | 4/2008 | Maekawa |
| 2008/0096128 A1 | 4/2008 | Takeda et al. |
| 2008/0241751 A1 | 10/2008 | Takeda et al. |
| 2010/0009299 A1 * | 1/2010 | Watanabe et al. ............. 430/326 |
| 2010/0239980 A1 | 9/2010 | Okuyama et al. |
| 2010/0291484 A1 * | 11/2010 | Tanaka et al. ............. 430/285.1 |
| 2010/0304301 A1 | 12/2010 | Tanaka et al. |
| 2011/0143266 A1 | 6/2011 | Tanaka et al. |
| 2011/0171579 A1 * | 7/2011 | Domon et al. ............. 430/285.1 |
| 2011/0177464 A1 | 7/2011 | Takeda et al. |

FOREIGN PATENT DOCUMENTS

| | | |
|---|---|---|
| CN | 1788239 A | 6/2006 |
| CN | 1825206 A | 8/2006 |
| CN | 101086619 A | 12/2007 |
| CN | 101387831 A | 3/2009 |
| EP | 1 684 118 A1 | 7/2006 |
| EP | 1 975 711 A1 | 10/2008 |
| EP | 2 146 245 A2 | 1/2010 |
| EP | 2 253 996 A1 | 11/2010 |
| GB | 2 415 790 A | 1/2006 |
| JP | A-2002-244297 | 8/2002 |
| JP | A-2004-149756 | 5/2004 |
| JP | A-2005-004224 | 1/2005 |
| JP | A-2006-169302 | 6/2006 |
| JP | A-2006-201532 | 8/2006 |
| JP | A-2006-215180 | 8/2006 |
| JP | A-2007-241060 | 9/2007 |
| JP | A-2008-096684 | 4/2008 |
| JP | A-2008-249762 | 10/2008 |
| JP | A-2008-249951 | 10/2008 |
| WO | WO 2009/060869 A1 | 5/2009 |

OTHER PUBLICATIONS

Apr. 5, 2011 European Search Report issued in European Patent Application 10015092.9.

(Continued)

*Primary Examiner* — Anca Eoff
(74) *Attorney, Agent, or Firm* — Oliff & Berridge, PLC

(57) ABSTRACT

There is disclosed a negative resist composition wherein a base resin contains at least repeating units represented by the following general formula (1) and general formula (2) and has a weight average molecular weight of 1,000 to 10,000, and the compound containing a nitrogen atom as a basic component contains one or more kinds of amine compounds having a carboxyl group and not having a hydrogen atom covalently bonded to a base-center nitrogen atom. There can be a negative resist composition in which a bridge hardly occurs, substrate dependence is low and a pattern with a high sensitivity and a high resolution can be formed, and a patterning process using the same.

20 Claims, No Drawings

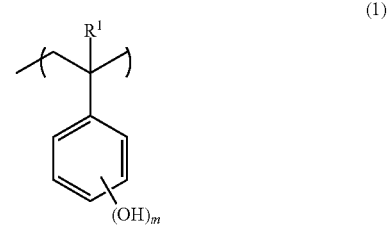

(1)

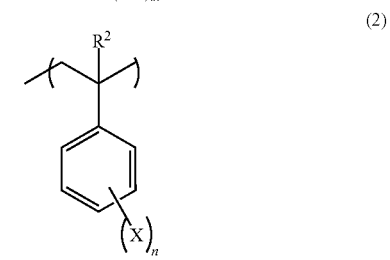

(2)

OTHER PUBLICATIONS

Sep. 1, 2010 European Search Report issued in European Application No. 10 004 363.7.
Jun. 15, 2012 Office Action issued in U.S. Appl. No. 12/662,435.
Jul. 24, 2012 Notification of Reasons for Refusal issued in Japanese Application No. 2009-119854 with English-language translation.
Apr. 6, 2012 Office Action issued in Chinese Application No. 201010559623.4 with partial English-language Translation.
Nov. 13, 2012 Office Action issued in U.S. Appl. No. 12/662,435.
Mar. 19, 2013 Office Action issued in Japanese Patent Application No. 2009-119854 (with partial English translation).
Jan. 14, 2013 Office Action issued in Chinese Patent Application No. 2010101781683 with partial English-language translation.

* cited by examiner

NEGATIVE RESIST COMPOSITION AND PATTERNING PROCESS

BACKGROUND OF THE INVENTION

1. Field of the Invention

The present invention relates to a negative resist composition and a patterning process using the same.

2. Description of the Related Art

In recent years, as an integrated circuit progresses toward a high integration, a further finer patterning is required. Especially, when a resist pattern of 0.2 μm or less is formed, as a usual manner, a chemically amplified resist composition wherein an acid generated by an exposure light acts as a catalyst, which a high sensitivity and a high resolution can be obtained, has been used. As the exposure light source, a high energy beam such as an ultraviolet beam, a far-ultraviolet beam and EB has been used, and especially, an exposure method by using EB or EUV has been drawing attention as the method that the finest pattern is expected among the methods currently under consideration.

In a resist composition, there are a positive type in which an exposed part is dissolved and a negative type in which an exposed part remains as a pattern. They are selected based on the ease of its use and depending on the required resist pattern. A chemically amplified negative resist composition usually contains a polymer soluble in an aqueous alkaline developer, an acid generator generating an acid by decomposition with an exposure light, and a crosslinker that insolubilizes the polymer into a developer by crosslinking the polymers among themselves by action of the acid as a catalyst (in a certain case, a polymer and a crosslinker are integrated together), and, in addition, usually contains a basic compound to control diffusion of the acid generated by the light exposure.

Many negative resist compositions using a phenolic unit as the alkaline-soluble unit constituting a polymer that is soluble in an aqueous alkaline developer have been developed, especially for exposure to a KrF excimer laser beam. These have not been used for an ArF excimer laser beam because the phenolic unit does not transmit the light when the exposure light having a wavelength of 150 to 220 nm is used. However, in recent years, these have been drawing attention again as a negative resist composition for exposure to EB and EUV, which are exposure methods to obtain a further finer pattern, as reported in Japanese Patent Laid-Open (kokai) No. 2006-201532, Japanese Patent Laid-Open (kokai) No. 2006-215180, and Japanese Patent Laid-Open (kokai) No. 2008-249762.

As a further finer pattern is required, negative resist compositions using a hydroxystyrene unit which is the typical structure of the phenolic unit has been improved many times. However, as a pattern size is miniaturized considerably to be 0.1 μm or less, a so-called bridge (a finely-filamented resist layer remained between pattern lines of a fine pattern) became a serious problem.

In addition, as for so-called substrate dependence of a pattern (a pattern profile change near the substrate due to a material of a substrate to be processed), with a miniaturization of a pattern to be obtained, even a small profile change has become a problem. Especially, when pattern forming is done by using a chemically amplified negative resist on a chromium oxynitride, the outermost surface material of a photomask blank, in processing of the photomask blank, there is a problem that a so-called undercut (a cleavage formed at the contact part of the resist pattern with the substrate) is formed, and the problem becomes more serious in a fine pattern.

Further, in the case of the resist elaboration as mentioned above, examples of characteristics to be demanded for resist compositions are not only a higher resolution which is a fundamental performance of a resist, but also a higher etching resistance. This is because a progressive miniaturization of patterns necessitates progressively decrease of resist film-thicknesses. Known as one technique for obtaining such a higher etching resistance, is a method, which also has been disclosed in Japanese Patent Laid-open (Kokai) No. 2008-249762, to introduce a compound: a polycyclic compound such as indene and acenaphthylene, which includes an aromatic ring(s) and a non-aromatic ring(s) having a carbon-carbon double bond conjugated with the aromatic ring; into a polymer having hydroxystyrene units as subsidiary components.

As disclosed in Japanese Patent Laid-open (Kokai) No. 2008-249762, a chemically amplified negative resist polymer using a base polymer mainly containing repeating units of a hydroxystyrene unit and a styrene unit substituted with an electron-attractive group, which is soluble in an alkaline developer and is made hardly soluble in the developer by the reaction with an acid for crosslinking, has been used as a resist polymer for the exposure to an electron beam and an extreme ultraviolet beam even after the most advanced lithography method by an ultraviolet beam was shifted to ArF. As the best result so far, obtained was a fine line-and-space pattern of 50 nm with few undercuts and without a bridge in forming a fine pattern of a resist film having a film thickness of 150 nm by the pattern exposure to an electron beam.

In turn, as polymers for positive resists, it has been proposed to use a polymer having only an indene skeleton such as described in Japanese Patent Application Laid-open (kokai) No. 2004-149756, while another method has been proposed in Japanese Patent Application Laid-open (kokai) No. 2006-169302 to use units having an acenaphthylene skeleton by combining them with a hydroxystyrene derivative.

As mentioned above, there have been various approaches to improve the problems such as a bridge and an undercut conventionally. However, especially in the case that a further finer pattern is to be formed by using a thin resist film having a film thickness of 100 nm or less, it is difficult to obtain desirable characteristics from a combination of materials constituting a conventional resist composition. That is, fine patterns collapse or a bridge occurs between pattern lines, thereby resulting in causing the problem that a high resolution could not be realized. Therefore, a further improvement has been desired.

SUMMARY OF THE INVENTION

The present invention was made in view of the situation as mentioned above and has an object to provide a negative resist composition in which a bridge hardly occurs in forming a pattern, substrate dependence is low, and a high sensitivity and a high resolution can be obtained and a patterning process using the same.

In order to solve the above problems, the present invention provides a negative resist composition comprising at least:
(A) a base resin that is alkaline-soluble and is made alkaline-insoluble by action of an acid, and/or a combination of a base resin that is alkaline-soluble and is made alkaline-insoluble by reaction with a crosslinker by action of an acid, with a crosslinker;
(B) an acid generator; and
(C) a compound containing a nitrogen atom as a basic component, wherein the base resin contains at least repeating units represented by the following general formula (1) and general formula (2) and has a weight average molecular weight of 1,000 to 10,000,

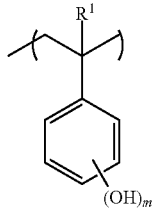

(1)

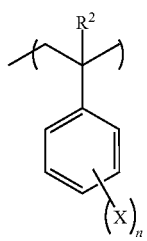

(2)

wherein each $R^1$ and $R^2$ independently represents a hydrogen atom or a methyl group, X represents an electron donative group except a hydroxyl group, and m and n represent an integer of 1 to 4, and the compound containing a nitrogen atom as a basic component contains at least one or more kinds of amine compounds having a carboxyl group and not having a hydrogen atom covalently bonded to a base-center nitrogen atom.

When the negative resist composition as mentioned above is used, a negative resist film having a high sensitivity and an excellent resolution, in which the problems such as a bridge and substrate dependence hardly occur in forming a pattern, can be obtained, and a fine pattern of 45 nm or less can be obtained.

It is preferable that the electron donative group represented by X is one or more groups selected from a hydrogen atom, a linear, a branched, or a cyclic alkyl group having 1 to 10 carbon atoms, an alkoxy group having 1 to 10 carbon atoms and a thioalkyl group having 1 to 10 carbon atoms. In addition, it is preferable that the electron donative group represented by X is one or more groups selected from a methyl group, an ethyl group, a methoxy group and an ethoxy group.

When the base resin into which these functional groups are introduced are combined with amine compounds having a carboxyl group and not having a hydrogen atom covalently bonded to a base-center nitrogen atom of the compound containing a nitrogen atom as the basic component (C), the problems of occurrence of a bridge between fine patterns and an undercut can be considerably improved.

It is preferable that the base resin further contains repeating units represented by the following general formula (3) and/or general formula (4),

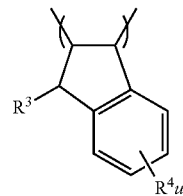

(3)

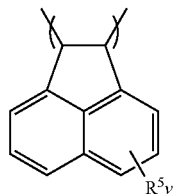

(4)

wherein each $R^3$, $R^4$ and $R^5$ independently represents a hydrogen atom, a hydroxyl group, an alkyl group having 1 to 10 carbon atoms or an alkoxy group having 1 to 10 carbon atoms, and u and v represent an integer of 0 to 5.

When the base resin, in addition to the repeating units represented by the foregoing general formula (1) and general formula (2), further contains repeating units represented by the foregoing general formula (3) and/or general formula (4), a higher etching resistance can be obtained, thereby enabling to obtain a thinner resist film.

It is preferable that the base resin has a weight average molecular weight of 1,000 to 5,000.

As mentioned above, when the base resin has a weight average molecular weight of 1,000 or more, a heat deformation of a pattern hardly occurs, and when the base resin has a weight average molecular weight of 5,000 or less, a bridge hardly occurs in developing much certainly in the case of using a certain material.

It is preferable that the acid generator of the component (B) contains at least one or more kinds of the compounds represented by the following general formula (5),

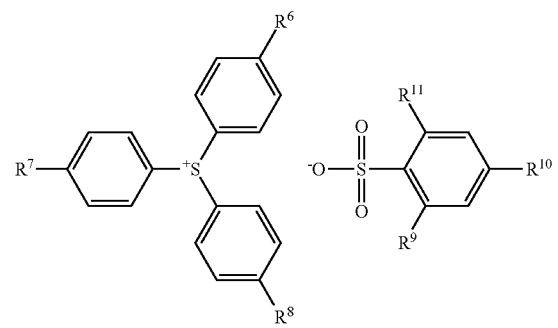

(5)

wherein $R^6$, $R^7$, and $R^8$ represent a hydrogen atom, or a linear or a branched alkyl group having 1 to 4 carbon atoms, wherein they may be the same or different; and $R^9$, $R^{10}$, and $R^{11}$ represent a linear or a branched alkyl group having 3 to 10 carbon atoms, wherein they may be the same or different.

The combination of the base resin containing the repeating units represented by the foregoing general formula (1) and general formula (2) with the basic component containing one or more kinds of amine compounds having a carboxyl group and not having a hydrogen atom covalently bonded to a base-center nitrogen atom of the present invention is effective especially when the acid generator represented by the foregoing general formula (5), generating an acid having a low diffusivity is used.

It is preferable that the amine compound having a carboxyl group and not having a hydrogen atom covalently bonded to a base-center nitrogen atom contains one or more kinds of the compounds represented by the following general formulae (6) to (8),

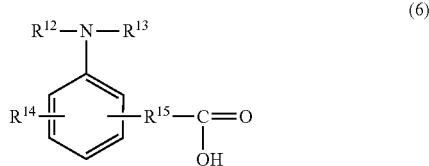
(6)

wherein $R^{12}$ and $R^{13}$ each represents a linear, a branched, or a cyclic alkyl group having 1 to 20 carbon atoms, an aryl group having 6 to 20 carbon atoms, an aralkyl group having 7 to 20 carbon atoms, a hydroxy alkyl group having 2 to 10 carbon atoms, an alkoxy alkyl group having 2 to 10 carbon atoms, an acyloxy alkyl group having 3 to 10 carbon atoms, or an alkyl thioalkyl group having 1 to 10 carbon atoms; $R^{12}$ and $R^{13}$ may be bonded to form a cyclic structure; $R^{14}$ represents a hydrogen atom, a linear, a branched, or a cyclic alkyl group having 1 to 20 carbon atoms, an aryl group having 6 to 20 carbon atoms, an aralkyl group having 7 to 20 carbon atoms, a hydroxy alkyl group having 2 to 10 carbon atoms, an alkoxy alkyl group having 2 to 10 carbon atoms, an acyloxy alkyl group having 3 to 10 carbon atoms, an alkyl thioalkyl group having 1 to 10 carbon atoms, or a halogen group; $R^{15}$ represents a single bond, a linear, a branched, or a cyclic alkylene group having 1 to 20 carbon atoms, or an arylene group having 6 to 20 carbon atoms;

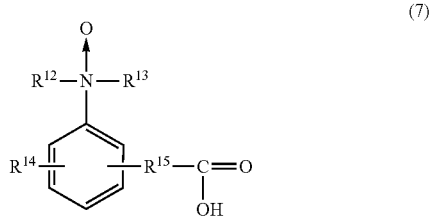
(7)

wherein $R^{12}$, $R^{13}$, $R^{14}$, and $R^{15}$ represent the same meaning as before;

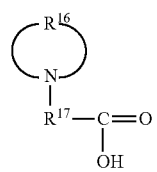
(8)

wherein $R^{16}$ represents a linear or a branched substitutable alkylene group having 2 to 20 carbon atoms which may contain one or a plurality of a carbonyl group, an ether group, an ester group, and a sulfide between the carbon-carbon bond of the alkylene group; and $R^{17}$ represents a linear, a branched, or a cyclic alkylene group having 1 to 20 carbon atoms, or an arylene group having 6 to 20 carbon atoms.

As mentioned above, a chemical structure of the amine compound having a carboxyl group and not having a hydrogen atom covalently bonded to a base-center nitrogen atom can be exemplified by the foregoing general formulae (6) to (8).

It is preferable that the basic component of the component (C) further contains at least one or more kinds selected from amine compounds represented by the following general formula (9) and general formula (10),

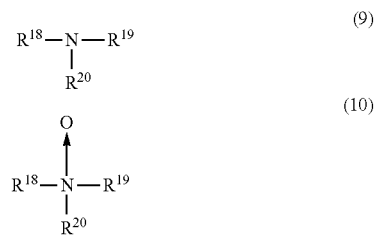

wherein $R^{18}$, $R^{19}$, and $R^{20}$ each represents a hydrogen atom, a linear, a branched, or a cyclic alkyl group having 1 to 20 carbon atoms, an aryl group having 6 to 20 carbon atoms, an aralkyl group having 7 to 20 carbon atoms, a hydroxy alkyl group having 2 to 10 carbon atoms, an alkoxy alkyl group having 2 to 10 carbon atoms, an acyloxy alkyl group having 3 to 10 carbon atoms, or an alkyl thioalkyl group having 1 to 10 carbon atoms; two of $R^{18}$, $R^{19}$, and $R^{20}$ may be bonded to form a cyclic structure or an aromatic ring.

As mentioned above, the basic component of the component (C) can further contain at least one or more kinds selected from the amine compound represented by the forgoing general formula (9) and general formula (10), in addition to the amine compound having a carboxyl group and not having a hydrogen atom covalently bonded to a base-center nitrogen atom.

Further, the present invention provides a resist patterning process, the resist patterning process by a lithography, wherein, at least, a resist film is formed over a substrate to be processed by using the above-mentioned negative resist composition, and the resist film is exposed to a high energy beam and then developed by an aqueous alkaline developer to obtain a resist pattern.

By using the resist patterning process of the present invention as mentioned above, even when a pattern having the minimum line width of 45 nm or less is formed, for example, generation of a bridge or an undercut can be suppressed, so that a resist pattern having an excellent resolution can be obtained.

Further, the resist film having a film thickness of 10 to 100 nm can be used.

As mentioned above, by using the resist patterning process of the present invention, a fine pattern having the minimum line width of 45 nm or less, for example, can be formed even when a thin resist film having a film thickness of 10 to 100 nm is used.

Further, a photomask blank can be used as the substrate to be processed. In addition, a photomask blank having an outermost surface made of a chromium compound film can be used as the photomask blank.

A sheet of photomask affects an entire performance of a semiconductor manufactured by using it, and thus a low LER is required. In addition, a high etching resistance is required because, in an etching process, the sheet is used in etching of a silicon compound film containing a transition metal and a transition metal compound film formed by a spattering method, in particular in etching of a film with a relatively slow etching speed such as a chromium compound film. Accordingly, the characteristic features of the resist patterning process of the present invention can be used advantageously.

In addition, the present invention enables to inhibit occurrence of an undercut and obtain a pattern having a high resolution stably even on a substrate like a photomask blank whose surface is composed of a material like a chromic material, which tends to cause an undercut, a pattern collapse, etc. in forming a negative resist pattern.

By using the negative resist composition of the present invention, a resist film having a high sensitivity, an excellent etching resistance and resolution can be obtained. For example, even when a line-and-space pattern of 45 nm or less is formed, occurrence of an undercut and a bridge at space portions can be suppressed. Further, even on a substrate to be processed whose surface is composed of a chromic compound, which tends to cause an undercut, an undercut is suppressed and a pattern having a desirable profile of the minimum line width of 45 nm or less and a high sensitivity can be formed.

DETAILED DESCRIPTION OF THE PREFERRED EMBODIMENTS

Although embodiments of the present invention will be explained hereinafter in detail, the present invention is not limited thereto.

As mentioned above, a negative resist composition, in which a bridge hardly occurs, substrate dependence is low and a pattern having an excellent resolution can be formed even in forming a fine pattern, has been required.

As mentioned above, in Japanese Patent Laid-Open (kokai) No. 2008-249762, a polymer comprising a hydroxystyrene unit and a styrene unit substituted with electron-attractive chlorine (that is, a chlorostyrene unit) is used as a styrene derivative unit, while a miscible system of triphenyl sulfonium-2,5-dimethylbenzene sulfonic acid and triphenyl sulfonium-2,4,6-triisopropylbenzene sulfonic acid is used as an acid generator.

In above Japanese Patent Laid-Open (kokai) No. 2008-249762, it is reported that conventionally, it had been considered that a solubility changing reaction mechanism of a common hydroxystyrene-type negative resist film was due to a reaction of a crosslinker having electrophilic functional group and a higher reactivity and contrast could be expected by introducing of an electron donative group into an aromatic ring of a repeating unit used in the polymer, but in checking the solubility change of material combinations used commonly at that time, a higher performance could be obtained rather by introducing of an electron attractive group into the aromatic ring. The reason why an undercut is suppressed in the case of using the polymer into which an electron attractive group is introduced is considered to be that the reactivity is suppressed appropriately by decrease of electron density in benzene ring.

However, when inventors of the present invention used the chemically amplified resist composition realizing a high resolution mentioned above to prepare the resist film with a thickness of 100 nm or less and then attempted to form a pattern having a minimum line width of less than 45 nm, there occurred the problem that fine patterns collapsed or a bridge occurred between pattern lines, and therefore, it was impossible to realize a high resolution. It is necessary that the undercut is further suppressed in order to inhibit the pattern-collapse. For this purpose, it is considered that an acid generator with low diffusion (that is, low reactivity) is applied, but many bridges occur because the reactivity of the polymer into which an electron attractive group is introduced is low. As the mixed acid generator described above, the reason why triphenyl sulfonium-2,5-dimethylbenzene sulfonic acid is used for the one with high diffusion and triphenyl sulfonium-2,4,6-triisopropylbenzene sulfonic acid is used for the one with low diffusion is to control the balance of an undercut and a bridge appropriately in the pattern. However, the above mentioned problem can not be dissolved by merely changing the mixing ratio of the acid generators in the case of the pattern formation with 45 nm or less. Inventors of the present invention assumed a working hypothesis that a high resolution is inhibited by lack of mechanical strength of the resist film used as the resist mentioned above in being developed by an alkaline developer.

Accordingly, based on the premise of using a styrene unit substituted with an electron donative group such as an alkyl group or an alkoxy group, which are considered to be capable of giving a high contrast (that is, to have a high reactivity with a crosslinker) even in the case that a resist film is thin, inventors of the present invention widely investigated combinations of the above-mentioned styrene unit and other materials. As a result, they found that in the case of combining with a basic compound having a specific structure, an undercut and a bridge hardly occur and a fine pattern can be developed without collapsing, thereby succeeded in accomplishing the present invention.

That is, as a negative resist composition, they widely investigated compositions giving a high performance together with a styrene-type polymer substituted with an electron donative group which is considered to be preferable from the standpoint of reaction mechanism, thereby found that in the case of combining with a basic compound mentioned later, even if easily available monomer having a relatively simple structure is used, a pattern having a good profile with the minimum line width of 45 nm or less can be formed by using a resist film with a film thickness of 100 nm or less by a certain optimization.

Firstly, the component (A) of the negative resist composition of the present invention, the base resin that is alkaline-soluble and is made alkaline-insoluble by action of an acid, and/or a combination of a base resin that is alkaline-soluble and is made alkaline-insoluble by reaction with a crosslinker by action of an acid, with a crosslinker, will be explained.

The base resin in the negative resist composition of the present invention contains at least repeating units represented by the following general formula (1) and general formula (2) and has a weight average molecular weight of 1,000 to 10,000,

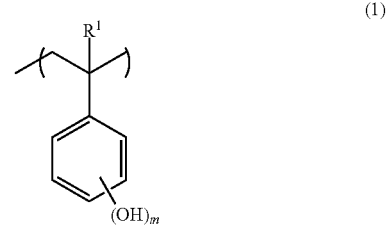

(2)

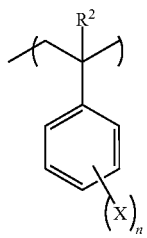

wherein each $R^1$ and $R^2$ independently represents a hydrogen atom or a methyl group, X represents an electron donative group except a hydroxyl group, and m and n represent an integer of 1 to 4.

Preferable examples of the electron donative group represented by X include one or more groups selected from a hydrogen atom, a linear, a branched, or a cyclic alkyl group having 1 to 10 carbon atoms, an alkoxy group having 1 to 10 carbon atoms and a thioalkyl group having 1 to 10 carbon atoms.

Especially, an alkyl group, an alkoxy group and a thioalkyl group are highly effective, and can realize the effects of the present invention advantageously. More specifically, preferable examples of the alkyl group include a methyl group, an ethyl group, a propyl group, a butyl group, a pentyl group, a hexyl group and constitutional isomers thereof, a cyclopentyl group, a cyclohexyl group, and the like. When X contains 10 or less carbon atoms, a solubility-reducing-effect of the base resin to an alkaline developer is not too strong, and there is no possibility of causing a scum (a development defect). Further, preferable examples of the alkoxy group include a methoxy group, an ethoxy group, a propoxy group, a butoxy group, a pentyloxy group, a hexyloxy group and constitutional isomers thereof in which each hydrocarbon part is isomerized, a cyclopentyloxy group, a cyclohexyloxy group, and the like. Further, examples of the thioalkyl group include a thiomethyl group, a thioethyl group, a thiopropyl group, a thiobutyl group, a thiopentyl group, a thiohexyl group and constitutional isomers thereof in which each hydrocarbon part is isomerized, a thiocyclopentyl group, a thiocyclohexyl group, and the like.

Especially preferable examples of the electron donative group represented by X include one or more groups selected from a methyl group, an ethyl group, a methoxy group and an ethoxy group. These substitutional groups are available stably and can give the electron-donative-group-effect to the base resin with keeping a balance among an etching property, a solubility property and substrate adhesivity.

It is preferable that the base resin in the negative resist composition of the present invention further contains, in addition to the styrene derivatives represented by the foregoing general formula (1) and general formula (2), repeating units represented by the following general formula (3) and/or general formula (4), (3)

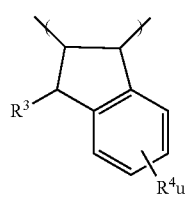

(4)

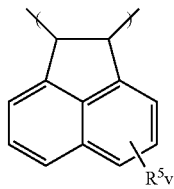

wherein each $R^3$, $R^4$ and $R^5$ independently represents a hydrogen atom, a hydroxyl group, an alkyl group having 1 to 10 carbon atoms or an alkoxy group having 1 to 10 carbon atoms, and u and v represent an integer of 0 to 5. By further introducing these units, rigidity is added to the polymer-chain, thereby enable to support the undercut-suppress-effect.

Each $R^3$, $R^4$ and $R^5$ of the foregoing general formulae (3) and (4) independently represents a hydrogen atom, a hydroxyl group, an alkyl group having 1 to 10 carbon atoms or an alkoxy group having 1 to 10 carbon atoms, and preferable examples of them include, in addition to a hydrogen atom and a hydroxyl group, an alkyl group: a methyl group, an ethyl group, a propyl group, a butyl group, a pentyl group, a hexyl group and constitutional isomers thereof, a cyclopentyl group, a cyclohexyl group, and the like. It is preferable that each $R^3$, $R^4$ and $R^5$ contains 1 to 10 carbon atoms because a solubility-reducing-effect of the base resin to an alkaline developer is not too strong and there is no possibility of causing a scum (a development defect). Further, preferable examples of the alkoxy group include a methoxy group, an ethoxy group, a propoxy group, a butoxy group, a pentyloxy group, a hexyloxy group and constitutional isomers thereof in which each hydrocarbon part is isomerized, a cyclopentyloxy group, a cyclohexyloxy group, and the like.

The base resin of the negative resist composition of the present invention can be obtained by a radical polymerization, a cationic polymerization, an anionic polymerization in a certain case, as described in Japanese Patent Laid-Open (kokai) No. 2008-249762, for example, and preferable is the anionic polymerization in order to obtain a polymer containing repeating units more randomly.

Here, in a radical polymerization, an introduction amount of the repeating units represented by the foregoing general formula (3) is not limited particularly, but it is preferably 30% by mol or less relative to the total amount of monomers in the base resin (the total amount of repeating units constituting the base resin). It is because, in this case, copolymerization can be performed with a good reproducibility. In addition, when the repeating unit represented by the foregoing general formula (4) is used, it is preferably 50% by mol or less of the total amount of monomers. It is because, in this case, the base resin can be considered to be one of polymers that realize the effects of the present invention more sufficiently.

In addition, the base resin in the negative resist composition of the present invention can contain other additional repeating units in the range not diminishing the function thereof. For example, the repeating units represented by the foregoing general formula (1), partly substituted with an acyl group such as a pivaloyl group or an acetyl group can be used in order to adjust a dissolution rate of the polymer. These additional repeating units can be contained in the range not being projected beforehand to diminish the function of the base resin by a person skilled in the art. When an introduction amount of these additional repeating units is 30% by mol or less relative to the total amount of repeating units constituting the base resin, the effects of the present invention can be obtained more effectively.

In copolymerization to obtain the base resin in a negative resist composition of the present invention by using each repeating unit mentioned above, one of the most important points in designing a content ratio of repeating units is a content ratio of repeating units having a phenolic hydroxyl group. It needs to be adjusted depending on a structure of repeating unit used, but as a rough standard, the total amount of repeating units having a phenolic hydroxyl group and thus providing the base resin with a solubility in alkali is preferably 50 to 95% by mol, and more preferably 60 to 85% by mol relative to the total amount of repeating units constituting the base resin. When the total amount of the repeating units having a phenolic hydroxyl group is 95% by mol or less, the alkaline dissolution rate at an unexposed portion is not excessively increased, and there is no possibility of causing problems in pattern formation after development. Further, when the total amount of the repeating units having a phenolic hydroxyl group is 50% by mol or more, there is no possibility of causing problems of difficulty in formation of fine patterns, occurrence of underdevelopment, and the like.

In addition, the amount of the above-mentioned repeating units substituted with an electron donative group is preferably 5 to 35% by mol relative to the total amount of all repeating units constituting the base resin.

Incidentally, when the base resin of the negative resist composition of the present invention contains only the repeating units represented by the foregoing general formula (1) and the repeating units represented by the foregoing general formula (2), a content ratio can be adjusted in the above-mentioned range, but when it further contains the repeating units represented by the foregoing general formula (3) and/or general formula (4), situations need to be classified according to whether each repeating unit has a hydroxyl group as $R^4$ or $R^5$ or not. That is, a repeating unit having a hydroxyl group as $R^4$ or $R^5$ is considered to be almost equivalent to the repeating unit represented by the foregoing general formula (1), while a repeating unit not having a hydroxyl group as $R^4$ or $R^5$ is considered to be almost equivalent to the repeating unit represented by the foregoing general formula (2), thereby obtaining a rough standard regarding the introduction ratio. It is noted that practically, a hydroxyl group introduced as $R^4$ or $R^5$ causes a reduction of solubility in an alkaline developer a little compared with a hydroxyl group in the foregoing general formula (1), so that the introduction ratio of the repeating units represented by the foregoing general formula (1) and the repeating units represented by the foregoing general formula (3) and/or general formula (4) needs to be a little higher compared with the introduction ratio of a case that all repeating units are represented by the foregoing general formula (1) or general formula (2).

In the above case, the introduction ratio of the repeating units represented by the foregoing general formula (1) and/or general formula (2) consequently decreases, but it is preferable that the introduction ratio of the repeating units represented by the foregoing general formula (1) is 20% by mol or more, and the introduction ratio of the repeating units represented by the foregoing general formula (2) is 1% by mol or more in order to obtain the effects of the present invention more effectively.

More specifically, preferable combinations of the repeating units can be exemplified by the following general formulae (11) to (13),

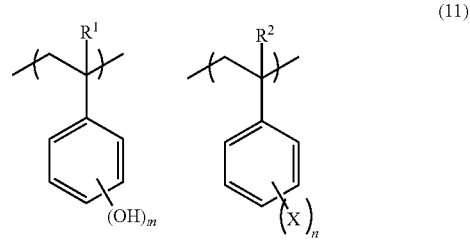

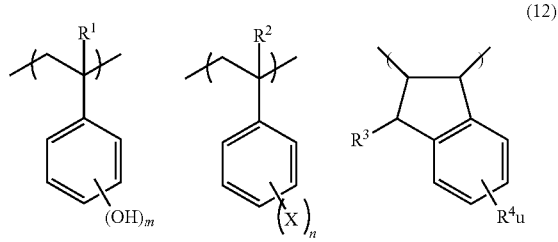

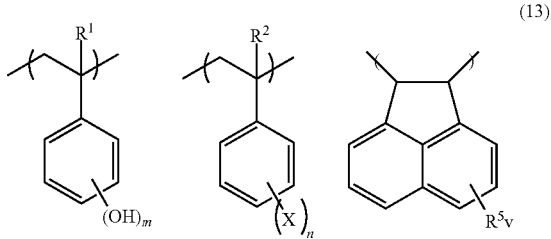

wherein each $R^1$ and $R^2$ independently represents a hydrogen atom or a methyl group, X represents an electron donative group except a hydroxyl group, and m and n represent an integer of 1 to 4, and each $R^3$, $R^4$ and $R^5$ independently represents a hydrogen atom, a hydroxyl group, an alkyl group having 1 to 10 carbon atoms or an alkoxy group having 1 to 10 carbon atoms, and u and v represent an integer of 0 to 5.

The above mentioned base resin can be easily synthesized by radically polymerizing corresponding monomers in a known manner or the like (see Japanese Patent Application Laid-open (kokai) No. 2008-249762, for example). It is also possible to adopt such a manner to conduct the polymerization in a state that the phenolic hydroxyl groups are each protected by an acyl group as a protective group which can be alkaline hydrolyzed, or each protected by an acetal, tertiary alkyl group which can be acid hydrolyzed, and then, to deprotect the phenolic hydroxyl groups.

Contrary, it is possible to once conduct polymerization by adopting monomers each having a phenolic hydroxyl group, and subsequently conduct a modifying reaction such as acylation of some hydroxyl groups so as to adjust a dissolution rate to establish a base resin to be finally used.

The base resin in the negative resist composition of the present invention contains: repeating units having phenolic hydroxyl groups to thereby provide solubility in alkali (which correspond to hydroxystyrene units and to styrene units substituted with hydroxyl groups, among the above-mentioned combination examples); and repeating units for suppressing a dissolution rate in an alkaline developer. At least a part of the repeating units for suppressing the dissolution rate in the alkaline developer includes the above-mentioned electron donative groups. Since the content ratio between these repeating units strongly affects a resolution, a pattern profile and the like of a resist, optimization of a copolymerization ratio is conducted after determining selection of the repeating units.

The base resin in the component (A) of the negative resist composition of the present invention have a weight average molecular weight of 1,000 to 10,000 (measurement is conducted by HLC-8120GPC by TOSOH CORPORATION; based on a gel permeation chromatography using a standard sample of polystyrene).

When the weight average molecular weight is less than 1,000, a heat resistance of the negative resist material is insufficient, and when the weight average molecular weight is more than 10,000, there is a problem that a resolution of the resist pattern is easily deteriorated and a defect in the resist pattern is easily occurred after development. Further, the weight average molecular weight of 5,000 or less is preferable because it can decrease the amount of line edge roughness.

Further, when the molecular weight distribution (Mw/Mn) of the base resin to be used in the negative resist composition of the present invention is narrow, there is no possibility that extraneous substances are found on patterns, or that pattern profiles are deteriorated after exposure, due to presence of polymers having lower molecular weights and/or higher molecular weights. Since the influence of the molecular weight and the molecular weight distribution tends to be increased as pattern rules are made finer, it is preferable that the molecular weight distribution of the multicomponent copolymer to be used is between 1.0 and 2.5, and particularly between 1.0 and 1.8, and is thus low in dispersibility, so as to obtain a resist material to be preferably used for a fine pattern.

A crosslinker is added into the negative resist composition of the present invention. Although it is possible to integrate the crosslinker with the polymer structure in some cases as briefly mentioned above in such a way to add units having epoxy groups into the polymer, it is typical to separately add such a material as described below.

The crosslinker reacts with the base resin by the aid of an acid generated from the photoacid generator as a catalyst, in a manner to form cross-linkages within and among molecules of the polymer, thereby making the base resin insoluble in alkali. Typically, this crosslinker is a compound having multiple functional groups which electrophilically react with an aromatic ring(s) or a hydroxyl group(s) to be included in constitutional units of the base polymer to thereby form linkages, and numerous compounds have been already known therefor.

While any one of known crosslinkers is basically usable as the crosslinker to be contained in the negative resist composition of the present invention, examples of preferable crosslinkers include alkoxymethylglycolurils, and alkoxymethyl melamines, and specific examples of alkoxymethylglycolurils include tetramethoxymethylglycoluril, 1,3-bis-methoxymethyl-4,5-bismethoxyethylethylene urea and bismethoxymethyl urea. Further, examples of alkoxymethyl melamines include hexamethoxymethyl melamine and hexaethoxymethyl melamine.

Examples of the addition amount of the crosslinker in the negative resist composition of the present invention include 2 to 40 mass parts, preferably 5 to 20 mass parts, relative to 100 mass parts of solid components (the base resin and the acid generator) of the resist composition. Further, the above-mentioned crosslinkers can be used solely or mixedly in two or more kinds.

Basically usable as the acid generator as the component (B) of the negative resist composition of the present invention is any one of known acid generators usable for chemically amplified resists (such as those described in Japanese Patent Application Laid-open (kokai) No. 2008-249762, and the like).

Examples of preferable photoacid generators include photoacid generators such as sulfonium salts, iodonium salts, sulfonyldiazomethanes, N-sulfonyloxyimides, which can be used solely or mixedly in two or more kinds. Further, examples of preferable counter anions to be possessed by sulfonic acids produced from the salts or compounds, include a benzenesulfonic acid anion, toluenesulfonic acid anion, 4-(4-toluenesulfonyloxy)benzenesulfonic acid anion, pentafluorobenzenesulfonic acid anion, 2,2,2-trifluoroethanesulfonic acid anion, nonafluorobutanesulfonic acid anion, heptadecafluorooctanesulfonic acid anion, camphorsulfonic acid anion, and the like.

Although the addition amount of the acid generator as the component (B) in the negative resist composition of the present invention is not particularly limited, such an addition amount is preferably 0.4 to 20 mass parts, more preferably 0.8 to 15 mass parts relative to 100 mass parts of the base resin as the component (A). It is possible to expect assurance of sensitivity and improvement of resolution by simultaneously increasing the addition amount of the acid generator and the addition amount of the basic component (C) to be described later, and typically 20 mass parts or less is preferable because it can avoid a possibility of lowering a sensitivity-improving-effect and uneconomical nature. Further, 0.4 mass part or more is preferable because it can eliminate a necessity to decrease the basic component down to a smaller amount so as to satisfy the demanded sensitivity and it can avoid a possibility that the resolution of the formed resist pattern is deteriorated.

Particularly, when the resist composition is used to form a resist film for irradiation of radiation or irradiation of electron beam thereto, addition of an acid generator is not problematic in energy attenuation of irradiated radiation within a film though higher sensitivity is scarcely obtained, so that the addition amount of the acid generator is preferably made to be a higher concentration such as preferably about 2.0 to 20 mass parts, as compared with a situation of adoption of excimer laser light.

Among the foregoing acid generators, those acid generators based on triphenylsulfonium benzenesulfonate represented by the following general formula (5) are preferable as an acid generator for the negative resist composition of the present invention.

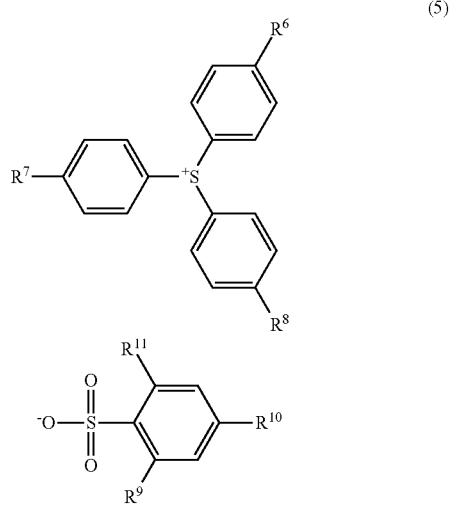

(5)

The benzenesulfonic acid portion, which is a counter anion of the acid generator, is appropriately adjusted between a purpose of diffusion control of the acid and a purpose of pattern profile control, by means of an alkyl group(s) to be introduced into its benzene nucleus. The diffusion is restrained in an order of methyl group<ethyl group<isopropyl group, and the sensitivity of resist is lowered simultaneously therewith. Basically, although the resolution tends to be improved by suppressing diffusion of the acid, the reactivity is then rather lowered occasionally.

Moreover, although it has been known to be desirable to suppress diffusion of an acid generator so as to decrease undercuts, the reactivity is conversely deteriorated then, thereby defectively making it difficult to increase a crosslinking density. As such, it has been typical to mixingly use an acid generator having 2,5-dimethylbenzenesulfonic acid which is enhanced in diffusion, and an acid generator having 2,4,6-triisopropylbenzenesulfonic acid which is suppressed in diffusion.

However, the base resin of the present invention, which contains a styrene unit substituted with the electron donative group represented by the foregoing general formula (2), has high crosslinking efficiency, and an acid generator generating an acid with low diffusion is effective. Preferable examples of the acid generator include 2,4,6-triisopropylbenzenesulfonic acid, 2,4,6-tripropylbenzenesulfonic acid, 2,4,6-tributylbenzenesulfonic acid, 2,4,6-tri-tert-butylbenzenesulfonic acid, 2,4,6-triamylbenzenesulfonic acid, and 2,4,6-triisoamylbenzenesulfonic acid.

It has been known that a solubility of a resist film in an alkaline developer decreases by an introduction of an alkyl group into a benzene nucleus of a triphenyl sulfonium cation part, and therefore, the alkali-solubility of the resist film can be controlled by the acid generator. When a dissolution rate of the base resin is high, an acid generator based on a triphenyl sulfonium in which an alkyl group is introduced is effective.

The negative resist composition of the present invention contains an amine compound having a carboxyl group and not having a hydrogen atom covalently bonded to a base-center nitrogen atom as the basic component of the component (C). By adding the component, even in the case of using a resist film with a film thickness of 100 nm or less, a fine pattern having a minimum line width of 45 nm or less can be formed with suppressing occurrence of an undercut and solving the bridge problem, when a polymer into which the repeating unit having an electron donative group and represented by the foregoing general formula (2) introduced is used as the above-mentioned base resin.

Here, it is preferable to adopt a tertiary amine having no hydrogen atoms covalently bonded to a base-center nitrogen atom to realize the effect to the maximum extent, because an amine compounds such as a primary amine having a hydrogen atom covalently bonded to a base-center nitrogen atom has no remedy effect of the undercut to the foregoing substrate even when the primary amine has a carboxyl group.

Further, it is considered that as for an amine compound such as 2-quinolinecarboxylic acid and nicotinic acid, each having a base-center nitrogen atom included in an aromatic ring, it has no hydrogen atom covalently bonded to a base-center nitrogen atom, but it is impossible to successfully arrange a carboxyl group at a substrate side because these amine compounds are weak base. Therefore, it is impossible to prevent generated acids from diffusing to the substrate and from being inactivated.

Undercuts are easily caused in the case that a substrate or the like has a surface which is composed of nitrided compound such as TiN, SiN, and SiON. Especially, in the case that the surface is composed of metal chromic compound, undercuts are considerably easily caused in cases of metal chromium and a chromium compound containing nitrogen and/or oxygen, and it is hard to avoid such a situation.

However, the negative resist composition of the present invention enables to form a pattern having a good profile even on a substrate whose outermost surface is composed of a chromic compound (a chromic compound film), thereby being used advantageously in a process of a photomask blank and the like.

Preferable examples of a specific chemical structure of the amine compound having a carboxyl group and not having a hydrogen atom covalently bonded to a base-center nitrogen atom include, without any limitations, the amine compounds represented by the following general formulae (6) to (8),

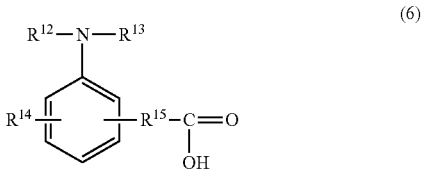

(6)

wherein $R^{12}$ and $R^{13}$ each represents a linear, a branched, or a cyclic alkyl group having 1 to 20 carbon atoms, an aryl group having 6 to 20 carbon atoms, an aralkyl group having 7 to 20 carbon atoms, a hydroxy alkyl group having 2 to 10 carbon atoms, an alkoxy alkyl group having 2 to 10 carbon atoms, an acyloxy alkyl group having 3 to 10 carbon atoms, or an alkyl thioalkyl group having 1 to 10 carbon atoms; $R^{12}$ and $R^{13}$ may be bonded to form a cyclic structure; $R^{14}$ represents a hydrogen atom, a linear, a branched, or a cyclic alkyl group having 1 to 20 carbon atoms, an aryl group having 6 to 20 carbon atoms, an aralkyl group having 7 to 20 carbon atoms, a hydroxy alkyl group having 2 to 10 carbon atoms, an alkoxy alkyl group having 2 to 10 carbon atoms, an acyloxy alkyl group having 3 to 10 carbon atoms, an alkyl thioalkyl group having 1 to 10 carbon atoms, or a halogen group; $R^{15}$ represents a single bond, a linear, a branched, or a cyclic alkylene group having 1 to 20 carbon atoms, or an arylene group having 6 to 20 carbon atoms;

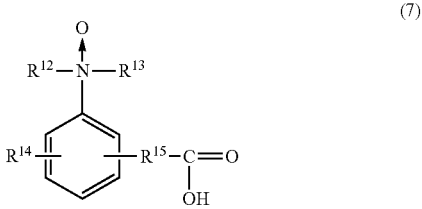

(7)

wherein $R^{12}$, $R^{13}$, $R^{14}$, and $R^{15}$ represent the same meaning as before;

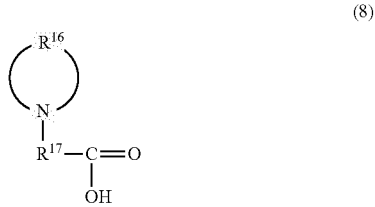

(8)

wherein $R^{16}$ represents a linear or a branched substitutable alkylene group having 2 to 20 carbon atoms which may contain one or a plurality of a carbonyl group, an ether group, an ester group, and a sulfide between the carbon-carbon bond of the alkylene group; and $R^{17}$ represents a linear, a branched, or a cyclic alkylene group having 1 to 20 carbon atoms, or an arylene group having 6 to 20 carbon atoms.

In the above structural formulae, without any limitations, examples of an aryl group having 6 to 20 carbon atoms concretely include a phenyl group, naphthyl group, anthryl group, phenanthryl group, pyrenyl group, naphthacenyl group, and fluorenyl group; examples of a linear, branched, or cyclic alkyl group having 1 to 20 carbon atoms concretely include a methyl group, ethyl group, propyl group, isopropyl group, butyl group, isobutyl group, t-butyl group, pentyl group, hexyl group, decyl group, cyclopentyl group, cyclohexyl group, and decahydronaphthalenyl group; examples of an aralkyl group having 7 to 20 carbon atoms concretely include a benzyl group, phenethyl group, phenylpropyl group, naphthylmethyl group, naphthylethyl group, and anthracenylmethyl group; examples of a hydroxy alkyl group having 2 to 10 carbon atoms concretely include a hydroxymethyl group, hydroxyethyl group, and hydroxypropyl group; examples of an alkoxyalkyl group having 2 to 10 carbon atoms concretely include a methoxymethyl group, ethoxymethyl group, propoxymethyl group, isopropoxymethyl group, butoxymethyl group, isobutoxymethyl group, t-butoxymethyl group, t-amyloxymethyl group, cyclohexyloxymethyl group, cyclopentyloxymethyl group; examples of an acyloxyalkyl group having 3 to 10 carbon atoms concretely include a formyloxymethyl group, acetoxymethyl group, propionyloxymethyl group, butyryloxymethyl group, pivaloyloxymethyl group, cyclohexane carbonyloxymethyl group, and decanoyloxymethyl group; examples of an alkyl thioalkyl group having 1 to 10 carbon atoms concretely include a methylthiomethyl group, ethylthiomethyl group, propylthiomethyl group, isopropylthiomethyl group, butylthiomethyl group, isobutylthiomethyl group, t-butylthiomethyl group, t-amylthiomethyl group, decyithiomethyl group, and cyclohexylthiomethyl group; and examples of the alkylene group having 1 to 20 carbon atoms concretely include a methylene group, ethylene group, methylethylene group, dimethylethylene group, propylene group, methylpropylene group, butylene group, pentylene group, hexylene group, decanyl group, cyclopentylene group, cyclohexylene group, methylenecyclohexylene group, decahydronaphthalenylene group; and examples of the arylene group having 6 to 20 carbon atoms concretely include phenylene group, naphthylene group, anthrylene group, phenanthrylene group, pyrenylene group, naphthacenylene group, and fluorenylene group.

Preferable examples of the amine compounds represented by the foregoing general formula (6) include, without any limitations, o-dimethylaminobenzoic acid, p-dimethylaminobenzoic acid, m-dimethylaminobenzoic acid, p-diethylaminobenzoic acid, p-dipropylaminobenzoic acid, p-diisopropylaminobenzoic acid, p-dibutylaminobenzoic acid, p-dipentylaminobenzoic acid, p-dihexylaminobenzoic acid, p-diethanolaminobenzoic acid, p-diisopropanolaminobenzoic acid, p-dimethanolaminobenzoic acid, 2-methyl-4-diethylaminobenzoic acid, 2-methoxy-4-diethylaminobenzoic acid, 3-dimethylamino-2-naphthalene acid, 3-diethylamino-2-naphthalene acid, 2-dimethylamino-5-bromobenzoic acid, 2-dimethylamino-5-chlorobenzoic acid, 2-dimethylamino-5-iodobenzoic acid, 2-dimethylamino-5-hydroxybenzoic acid, 4-dimethylaminophenylacetic acid, 4-dimethylaminophenylpropionic acid, 4-dimethylaminophenylbutyric acid, 4-dimethylaminophenylmalic acid, 4-dimethylaminophenylpyruvic acid, 4-dimethylaminophenyllactic acid, 2-(4-dimethylaminophenyl)benzoic acid, and 2-(4-(dibutylamino)-2-hydroxybenzoyl)benzoic acid.

Preferable examples of the amine compound represented by the general formula (7) include compounds obtained by oxidizing each example of the amine compounds represented by the foregoing general formula (6), without any limitations.

Preferable examples of the amine compound represented by the general formula (8) will be concretely enumerated below, without any limitations.

Namely, examples thereof include 1-piperidinepropionic acid, 1-piperidinebutyric acid, piperidinemalic acid, 1-piperidinepyruvic acid, 1-piperidinelactic acid, and the like.

The amine compound having an amine oxide structure represented by the general formula (7) is to be produced by selecting optimum techniques corresponding to the structures of the compounds. Examples thereof include a technique to adopt an oxidation reaction using an oxidizing agent for a nitrogen-containing compound, and a technique to adopt an oxidation reaction of a nitrogen-containing compound in a diluted solution of hydrogen peroxide, without any limitations. This will be explained in detail.

Exemplarily described below is a production method by an esterification reaction of a nitrogen-containing alcohol compound, and this is also applicable to synthesis of the compound represented by the general formula (7).

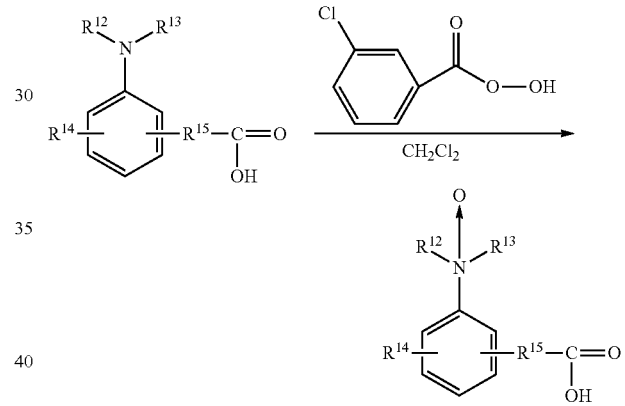

In the above formula, although this reaction is an oxidation reaction of amine adopting an oxidizing agent (m-chloroperbenzoic acid), this reaction can be conducted by another oxidizing agent in a usual manner of an oxidation reaction. After the reaction, mixed reaction products can be purified by usual manners such as distillation, chromatography and recrystallization as appropriate.

In these amine compounds having a carboxyl group and not having a hydrogen atom covalently bonded to a base-center nitrogen atom inside a molecule, the existence of a functional group substituted with a nitrogen atom has made possible to capture the generated acid rapidly while the carboxyl group is arranged on the substrate side so that an effect to prevent the generated acid from inactivation caused by diffusion to the substrate may be expected. As a result of the foregoing, it may be assumed that a pattern profile having a high resolution and an excellent verticality at the substrate's interface of the photoresist into which the amine compound having a carboxyl group of the present invention is added can be obtained.

Accordingly, a much better pattern profile can be obtained by appropriately adjusting the amine compound having a carboxyl group and not having a hydrogen atom covalently bonded to a base-center nitrogen atom in accordance with its physical properties such as volatility, basicity, a capturing rate of an acid, and a diffusion rate in a resist, and also in accordance with a combination of the base resin and the acid generator to be used.

As mentioned above, the foregoing effect of suppressing the undercut formation by the amine compound having a carboxyl group and not having a hydrogen atom covalently bonded to a base-center nitrogen atom inside a molecule is realized by orientation of the carboxyl group at a substrate side. Accordingly, in order to obtain this effect, it is not necessary that the entire basic component (C) to be added be the amine compound having a carboxyl group and not having a hydrogen atom covalently bonded to a base-center nitrogen atom inside a molecule; thus it can be used in combination with a conventionally used basic component other than the above-mentioned amine compound having a carboxyl group and not having a hydrogen atom covalently bonded to a base-center nitrogen atom inside a molecule (that is, non-'amine compound having a carboxyl group and not having a hydrogen atom covalently bonded to a base-center nitrogen atom inside a molecule' or 'other amine'). It is noted that the above-mentioned working mechanism is extrapolated from the realized effects.

Basically, a lot of heretofore known basic components usable in a chemically amplified resist (which are described in Japanese Patent Laid-Open (kokai) No. 2008-249762, for example,) can be used as the above-mentioned other amine compound (a basic component other than the amine compound having a carboxyl group and not having a hydrogen atom covalently bonded to a base-center nitrogen atom). Examples thereof include, as disclosed in above-mentioned Japanese Patent Laid-Open (kokai) No. 2008-249762, primary, secondary, and tertiary aliphatic amines; mixed amines; aromatic amines; heterocyclic amines; a nitrogen-containing compound having a carboxyl group; a nitrogen-containing compound having a sulfonyl group; a nitrogen-containing compound having a hydroxyl group; a nitrogen-containing compound having a hydroxyphenyl group; an alcoholic nitrogen-containing compound; an amide derivative; and an imide derivative, and the like.

Especially, the amine compound represented by the following general formula (9) or general formula (10) is a useful compound for the combination,

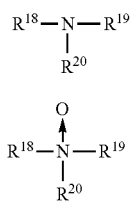

wherein $R^{18}$, $R^{19}$, and $R^{20}$ each represents a hydrogen atom, a linear, a branched, or a cyclic alkyl group having 1 to 20 carbon atoms, an aryl group having 6 to 20 carbon atoms, an aralkyl group having 7 to 20 carbon atoms, a hydroxy alkyl group having 2 to 10 carbon atoms, an alkoxy alkyl group having 2 to 10 carbon atoms, an acyloxy alkyl group having 3 to 10 carbon atoms, or an alkyl thioalkyl group having 1 to 10 carbon atoms; two of $R^{18}$, $R^{19}$, and $R^{20}$ may be bonded to form a cyclic structure or an aromatic ring.

When the amine compound having a carboxyl group and not having a hydrogen atom covalently bonded to a base-center nitrogen atom is used as a mixture with the typical other amine compound as mentioned above, the blending ratio (mass ratio) of the foregoing amine compound having a carboxyl group and not having an active hydrogen atom to the other amine compound is preferably in the range of 100:0 to 10:90, and more preferable in the range of 100:0 to 30:70.

In addition, the basic component (C) can be added singly or in combination of two or more kinds; its total blending amount in a mixture with a base polymer of 100 mass parts is preferably 0.01 to 2 mass parts, in particular 0.01 to 1 mass part. The adding amount of 0.01 to 2 mass parts is preferable because it can provide a blending effect efficiently and avoid a possibility of an excessive decrease in the sensitivity.

An organic solvent used for preparing the resist composition of the present invention is any organic solvent in which the base resin, the acid generator, the basic component, other additives, and the like are soluble. Examples of such an organic solvents include: ketones such as cyclohexanone and methyl-n-amylketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate; and lactones such as γ-butyrolactone; which can be used solely or mixedly in two or more kinds, without any limitation. Desirably usable in the present invention among them are ethyl lactate, propylene glycol monomethyl ether, propylene glycol monomethyl ether acetate, and mixed solvents of them, since they are the most excellent in solubility for the acid generator in the resist composition.

The amount of the organic solvent to be used is preferably 1,000 to 10,000 mass parts, in particular 2,000 to 9,700 mass parts, relative to 100 mass parts of the base resin. By adjusting the concentration like this, a thin resist film having a film thickness of 10 to 100 nm, for example, can be obtained stably and with a high smoothness by using a spin-coating method.

Other than the components as mentioned above, the negative resist composition of the present invention may contain a surfactant (D) that is used conventionally as an arbitrary component to improve the coating properties. Meanwhile, the adding amount of the arbitrary component can be made to a usual amount in the range not damaging the effects of the present invention.

Examples of the surfactant include, without particular limitations, a polyoxyethylene alkyl ether such as polyoxyethylene lauryl ether, polyoxyethylene stearyl ether, polyoxyethylene cetyl ether, and polyoxyethylene olein ether; a polyoxyethylene alkylaryl ether such as polyoxyethylene octylphenol ether and polyoxyethylene nonylphenol ether; a polyoxyethylene polyoxypropylene block copolymer; a sorbitane aliphatic acid ester such as sorbitane monolaurate, sorbitane monopalmitate, and sorbitane monostearate; a nonionic surfactant of a polyoxyethylene sorbitane aliphatic acid ester such as polyoxyethylene sorbitane monolaurate, polyoxyethylene sorbitane monopalmitate, polyoxyethylene sorbitane monostearate, polyoxyethylene sorbitane trioleate, and polyoxyethylene sorbitane tristearate; a fluorinated surfactant such as F-Top EF301, EF303, and EF352 (manufactured by Jemco Inc.), Megafac F171, F172, F173, R08, R30, R90, and R94 (manufactured by Dainippon Ink & Chemicals, Inc.), Flolade FC-430, FC-431, FC-4430, and FC-4432 (manufactured by Sumitomo 3M Ltd.), Asahi Guard AG710, Surflon S-381, S-382, S-386, SC101, SC102, SC103, SC104, SC105 and SC106, Surfinol E1004, KH-10, KH-20, KH-30, and KH-40 (manufactured by Asahi Glass Co., Ltd.); an organosiloxane polymer such as KP-341, X-70-092, and X-70-093 (manufactured by Shin-Etsu Chemical Co., Ltd.); and an acrylic acid or a methacrylic acid polymer such as Polyflow No. 75 and No. 95 (manufactured by Kyoeisha Yushikagaku Kogyo K. K.). Further, a polymer-type surfactant obtained by ring-opening polymerization of a fluorinated oxetane is preferably used because it has a merit not much affecting the resist coating properties even if the addition amount changes. As for the example of it, PF-636 (manufactured by OMNOVA Solutions Inc.) may be mentioned. These surfactants may be used singly or in combination of two or more kinds of them.

The adding amount of the surfactant in the negative resist composition of the present invention is 2 mass parts or less, and preferably 1 mass part or less, relative to 100 mass parts of the base resin (A) in the negative resist composition.

Formation of a resist film onto a substrate to be processed by using the negative resist composition of the present invention is done via a coating step of the negative resist composition over the substrate to be processed and a pre-baking step thereafter, wherein any of these steps is carried out by a heretofore known method, so that a resist film having the film thickness of 10 to 100 nm, depending on the purpose, can be formed.

As mentioned above, by using the negative resist composition of the present invention, occurrence of an undercut and a bridge can be suppressed and a fine pattern having the minimum line width of 45 nm or less can be formed with a high sensitivity even when the pattern is formed by using a thin resist film having a film thickness of 10 to 100 nm.

As to the coating step, there are several known coating methods other than a spin-coating method; but when a thin film having the resist film thickness of 10 to 100 nm is formed, the use of a spin-coating method is preferable in order to obtain a uniform film thickness.

In the case that the substrate to be processed is a semiconductor wafer, coating conditions at the time of a spin-coating need to be adjusted according to a wafer size, an intended film thickness, a composition of the resist composition, and the like. When a resist film with a film thickness of about 100 nm is intended to be obtained by using an 8-inch wafer (with a diameter of 200 mm), the resist composition is cast on the wafer, which is then followed by rotation with the rotation speed of 4,000 to 5,000 revolutions/minute for 40 seconds; by it a resist film having a high uniformity can be formed. Here, the amount of the solvent to be used to prepare the resist composition is preferably 1,400 to 1,600 mass parts relative to 100 mass parts of the base resin.

Then, the resist film formed by the method as mentioned above is pre-baked in order to remove an excess solvent remained in the film. The conditions of the pre-bake, when it is done on a hot plate, are: usually the temperature range of 80 to 130° C. and the time range of 1 to 10 minutes, and preferably 90 to 110° C. and 3 to 5 minutes.

In the case that the substrate to be processed is a photomask blank, the coating conditions need to be adjusted according to a blank size, an intended film thickness, a composition of the resist composition, and the like, by the same token. When a resist film having a film thickness of about 100 nm is intended to be formed on a square blank with 15.2 cm×15.2 cm, after casting the resist composition on the blank, by rotating it with the rotation speed of 1,000 to 3,000 revolutions/minute for 2 seconds, and then with the rotation speed of 800 revolutions/minute or less for 30 seconds, the resist film having a high uniformity can be formed. Here, the amount of the solvent to be used to prepare the resist composition is 2,000 to 9,700 mass parts relative to 100 mass parts of the base resin.

Then, the resist film formed by the method as mentioned above is pre-baked in order to remove an excess solvent remained in the film. The conditions of the pre-bake, when the pre-bake is done on a hot plate, are: usually the temperature range of 80 to 130° C. and the time range of 4 to 20 minutes, and preferably 90 to 110° C. and 8 to 12 minutes.

Subsequently, the resist film obtained as mentioned above is subjected to a pattern exposure to form an intended pattern. In the case of a semiconductor processing, the exposure is done by covering the foregoing resist film with a mask to form an intended pattern, and a high energy beam such as a far-ultraviolet beam, an excimer laser, an X-ray and an electron beam is used with the exposure dose being 1 to 100 $\mu C/cm^2$ and preferably 10 to 100 $\mu C/cm^2$. In addition to an ordinary exposure method, an immersion method, in which the space between a projection lens and a resist film is immersed in a liquid, can also be used as appropriate.

In the case of processing a photomask blank, a pattern exposure is usually done by a beam exposure because many of the identical products are not intended to be made by the processing. An electron beam is generally used as a high energy beam, but the other foregoing light source can also be used with the beam by the same token.

Usually after the exposure, in order to carry out a chemical amplification reaction by diffusing the acid, a post-exposure bake (PEB) is done, for example, on a hot plate in the temperature range of 60 to 150° C. and in the time range of 4 to 20 minutes, preferably 80 to 140° C. and 8 to 12 minutes. Then, the development is done to form an intended pattern on the substrate by using an aqueous alkaline developer such as tetramethyl ammonium hydroxide (TMAH) with a concentration of 0.1 to 5% by mass, preferably 2 to 3% by mass, with a time of 0.1 to 3 minutes, preferably 0.5 to 2 minutes and with an ordinary method such as a dip method, a puddle method and a spray method. In addition, the pattern size can be adjusted by a further heat treatment (thermal flow) after the development, as appropriate. Incidentally, the negative resist composition of the present invention is most suitably used for fine patterning by a high energy beam, in particular, a far-ultraviolet beam or an excimer laser having a wavelength of 250 to 120 nm, an extreme ultraviolet beam, an X-ray, and an electron beam.

As to a substrate to be processed for a lithography applied with a patterning process using the negative resist composition of the present invention, any substrate such as a semiconductor wafer, an intermediate substrate in the semiconductor manufacturing, and a photomask substrate can be used as far as it uses a lithography by a photoresist, but a substrate having a film especially formed of a metal compound by such a method as spattering can realize the effects of the present invention advantageously. Especially in a photomask blank in which a chromium compound film is formed at the outermost surface as a light-shielding film or as an etching mask film, profile control of the resist pattern at the substrate's interface is so difficult and occurrence of an undercut is caused so easily that the effects of the present invention especially useful. Examples of the chromium compound usefully applied by the present invention as the substrate's outermost surface material include a metal chromium, chromium oxide, chromium nitride, chromium carbide, chromium oxynitride, chromium oxycarbide, chromium carbonitride, and chromium oxycarbonitride.

EXAMPLES

Hereinafter, the present invention will be explained specifically by Synthesis Example, Comparative Synthesis Example, Examples and Comparative Examples, but the present invention is not limited to the Examples as described below.

Synthesis Example 1

Poured into a flask of 3 L were 238.0 g of 4-acetoxystyrene, 22.6 g of 4-methoxystyrene, and 189.4 g of indene, as well as 675 g of toluene as a solvent. This reaction vessel was cooled down to −70° C. under nitrogen atmosphere, and repetitively subjected to degasification under reduced pressure and to a nitrogen flow, three times. After temperature elevation up to a room temperature, 40.5 g of 2.2'-azobis(2,4-dimethylvaleronitrile): V-65 (produced by Wako Pure Chemical Industries, Ltd.) as a polymerization initiator was added into the mixture; after further temperature elevation up to 45° C., reaction was conducted for 20 hours; and after temperature elevation thereafter up to 55° C., reaction was further conducted for 20 hours. This reaction solution was then concentrated to ½, and precipitated in 15.0 L of a methanol solution; and the obtained white solid was filtered, followed by drying at 40° C. under reduced pressure, to obtain 311 g of a white polymer.

This polymer was again dissolved in a mixture of 488 g of methanol and 540 g of tetrahydrofuran, followed by addition of 162 g of triethylamine and 32 g of water thereinto, thereby conducting a deprotection reaction at 60° C. for 40 hours. As a fractionation step, after the reaction solution was concentrated, it was dissolved in a mixed solvent of 548 g of methanol and 112 g of acetone, and then 990 g of hexane was dropped into the solution for 10 minutes. This mixed white turbid solution was settled and separated into the layers, and the lower layer (polymer layer) was taken out, and concentrated. Further, the condensed polymer was dissolved again in a mixed solvent of 548 g of methanol and 112 g of acetone, a dispersion and separation operation to the solution was done by using 990 g of hexane, and the obtained lower layer (polymer layer) was concentrated. This condensed solution was dissolved in 870 g of ethyl acetate, thereafter once subjected to neutralizing separation washing by a mixed liquid of 250 g of water and 98 g of acetic acid, and further subjected to separation washing once by 225 g of water and 75 g of pyridine, and four times by 225 g of water. Thereafter, the ethyl acetate solution of the upper layer was concentrated, dissolved in 250 g of acetone, precipitated in 15 L of water, and filtered, followed by vacuum drying at 50° C. for 40 hours, to obtain 187 g of a white polymer.

The obtained polymer was subjected to $^{13}C$, $^1H$-NMR, and GPC measurements, thereby obtaining the following analysis results:
Copolymerization composition ratio (molar ratio):
hydroxystyrene:4-methoxystyrene:indene=76.7:12.5:10.8
Weight-average molecular weight (Mw)=4,200
Molecular weight distribution (Mw/Mn)=1.59
This polymer was regarded as (Polymer-1).

Synthesis Example 2

Synthesis of a polymer was conducted in the same manner as Synthesis Example 1, while using 11.0 g of 4-methylstyrene instead of 22.6 g of 4-methoxystyrene.
The obtained polymer was subjected to $^{13}C$, $^1H$-NMR, and GPC measurements, thereby obtaining the following analysis results:
Copolymerization composition ratio (molar ratio):
hydroxystyrene:4-methylstyrene:indene=76.9:12.9:10.2
Weight-average molecular weight (Mw)=4,100
Molecular weight distribution (Mw/Mn)=1.58
This polymer was regarded as (Polymer-2).

Synthesis Example 3

Poured into a flask of 3 L were 222.0 g of acetoxystyrene, 32.6 g of 4-methoxystyrene, and 30.0 g of acenaphthylene, as well as 675 g of toluene as a solvent. This reaction vessel was cooled down to −70° C. under nitrogen atmosphere, and repetitively subjected to degasification under reduced pressure and to a nitrogen flow, three times. After temperature elevation up to a room temperature, 40.1 g of 2.2'-azobis(2,4-dimethylvaleronitrile): V-65 (produced by Wako Pure Chemical Industries, Ltd.) as a polymerization initiator was added into the mixture; after further temperature elevation up to 45° C., reaction was conducted for 20 hours; and after temperature elevation thereafter up to 55° C., reaction was further conducted for 20 hours. This reaction solution was then concentrated to ½, and precipitated in 15.0 L of a methanol solution; and the obtained white solid was filtered, followed by drying at 40° C. under reduced pressure, to obtain 299 g of a white polymer.

This polymer was again dissolved in a mixture of 488 g of methanol and 540 g of tetrahydrofuran, followed by addition of 162 g of triethylamine and 32 g of water thereinto, thereby conducting a deprotection reaction at 60° C. for 40 hours. As a fractionation step, after the reaction solution was concentrated, it was dissolved in a mixed solvent of 548 g of methanol and 112 g of acetone, and then 990 g of hexane was dropped into the solution for 10 minutes. This mixed white turbid solution was settled and separated into the layers, and the lower layer (polymer layer) was concentrated. Further, the condensed polymer was dissolved again in a mixture of 548 g of methanol and 112 g of acetone, a dispersion and separation operation to the solution was done by using 990 g of hexane, and the obtained lower layer (polymer layer) was concentrated. This condensed solution was dissolved in 870 g of ethyl acetate, thereafter once subjected to neutralizing separation washing by a mixed liquid of 250 g of water and 98 g of acetic acid, and further subjected to separation washing once by 225 g of water and 75 g of pyridine, and four times by 225 g of water. Thereafter, the ethyl acetate solution of the upper layer was concentrated, dissolved in 250 g of acetone, precipitated in 15 L of water, and filtered, followed by vacuum drying at 50° C. for 40 hours, to obtain 165 g of a white polymer.

The obtained polymer was subjected to $^{13}C$, $^1H$-NMR, and GPO measurements, thereby obtaining the following analysis results:
Copolymerization composition ratio (molar ratio):
hydroxystyrene:4-methoxystyrene:acenaphthylene=77.0:12.5:10.5
Weight-average molecular weight (Mw)=4,700
Molecular weight distribution (Mw/Mn)=1.63
This polymer was regarded as (Polymer-3).

Synthesis Example 4

Synthesis of a polymer was conducted in the same manner as Synthesis Example 3, while using 26.5 g of 4-methylstyrene instead of 32.6 g of 4-methoxystyrene.
The obtained polymer was subjected to $^{13}C$, $^1H$-NMR, and GPC measurements, thereby obtaining the following analysis results:
Copolymerization composition ratio (molar ratio):
hydroxystyrene:4-methylstyrene:acenaphthylene=76.5:

13.0:10.5
Weight-average molecular weight (Mw)=5,000
Molecular weight distribution (Mw/Mn)=1.61
This polymer was regarded as (Polymer-4).

Synthesis Example 5

Synthesis of a polymer was conducted in the same manner as Synthesis Example 3, while using 23.5 g of styrene instead of 32.6 g of 4-methoxystyrene.
The obtained polymer was subjected to $^{13}$C, $^{1}$H-NMR, and GPC measurements, thereby obtaining the following analysis results:
Copolymerization composition ratio (molar ratio):
hydroxystyrene:styrene:acenaphthylene=76.5:12.8:10.7
Weight-average molecular weight (Mw)=5,000
Molecular weight distribution (Mw/Mn)=1.61
This polymer was regarded as (Polymer-5).

Synthesis Example 6

Poured into a flask of 3 L were 354.4 g of acetoxystyrene and 95.6 g of 4-methoxystyrene, as well as 1500 g of toluene as a solvent. This reaction vessel was cooled down to −70° C. under nitrogen atmosphere, and repetitively subjected to degasification under reduced pressure and to a nitrogen flow, three times. After temperature elevation up to a room temperature, 23.6 g of AIBN (produced by Wako Pure Chemical Industries, Ltd.) as a polymerization initiator was added into the mixture; after further temperature elevation up to 65° C., reaction was conducted for 40 hours. This reaction solution was then concentrated to ½, and precipitated in 20.0 L of a methanol solution; and the obtained white solid was filtered, followed by drying at 40° C. under reduced pressure, to obtain 420 g of a white polymer.
This polymer was again dissolved in a mixture of 488 g of methanol and 540 g of tetrahydrofuran, followed by addition of 162 g of triethylamine and 32 g of water thereinto, thereby conducting a deprotection reaction at 60° C. for 40 hours. As a fractionation step, after the reaction solution was concentrated, it was dissolved in a mixed solvent of 822 g of methanol and 168 g of acetone, and then 1485 g of hexane was dropped into the solution for 10 minutes. This mixed white turbid solution was settled and separated into the layers, and the lower layer (polymer layer) was concentrated. Further, the condensed polymer was dissolved again in a mixture of 822 g of methanol and 168 g of acetone, a dispersion and separation operation to the solution was done by using 1485 g of hexane, and the obtained lower layer (polymer layer) was concentrated. This condensed solution was dissolved in 1300 g of ethyl acetate, thereafter once subjected to neutralizing separation washing by a mixed liquid of 375 g of water and 98 g of acetic acid, and further subjected to separation washing once by 375 g of water and 75 g of pyridine, and four times by 225 g of water. Thereafter, the ethyl acetate solution of the upper layer was concentrated, dissolved in 375 g of acetone, precipitated in 20 L of water, and filtered, followed by vacuum drying at 50° C. for 40 hours, to obtain 280 g of a white polymer.
The obtained polymer was subjected to $^{13}$C, $^{1}$H-NMR, and GPC measurements, thereby obtaining the following analysis results:
Copolymerization composition ratio (molar ratio):
hydroxystyrene:4-methoxystyrene=75.8:24.2
Weight-average molecular weight (Mw)=5,200
Molecular weight distribution (Mw/Mn)=1.62
This polymer was regarded as (Polymer-6).

Synthesis Example 7

Synthesis of a polymer was conducted in the same manner as Synthesis Example 6, while using 84.2 g of 4-methylstyrene instead of 95.6 g of 4-methoxystyrene.
The obtained polymer was subjected to $^{13}$C, $^{1}$H-NMR, and GPC measurements, thereby obtaining the following analysis results:
Copolymerization composition ratio (molar ratio):
hydroxystyrene:4-methylstyrene=76.6:23.4
Weight-average molecular weight (Mw)=4,700
Molecular weight distribution (Mw/Mn)=1.88
This polymer was regarded as (Polymer-7).

Comparative Synthesis Example 1

Poured into a flask of 3 L were 354.4 g of acetoxystyrene and 94.6 g of 4-chlorostyrene, as well as 1500 g of toluene as a solvent. This reaction vessel was cooled down to −70° C. under nitrogen atmosphere, and repetitively subjected to degasification under reduced pressure and to a nitrogen flow, three times. After temperature elevation up to a room temperature, 23.6 g of AIBN (produced by Wako Pure Chemical Industries, Ltd.) as a polymerization initiator was added into the mixture; after further temperature elevation up to 65° C., reaction was conducted for 40 hours. This reaction solution was then concentrated to ½, and precipitated in 20.0 L of a methanol solution; and the obtained white solid was filtered, followed by drying at 40° C. under reduced pressure, to obtain 420 g of a white polymer.
This polymer was again dissolved in a mixture of 488 g of methanol and 540 g of tetrahydrofuran, followed by addition of 162 g of triethylamine and 32 g of water thereinto, thereby conducting a deprotection reaction at 60° C. for 40 hours. As a fractionation step, after the reaction solution was concentrated, it was dissolved in a mixed solvent of 822 g of methanol and 168 g of acetone, and then 1485 g of hexane was dropped into the solution for 10 minutes. This mixed white turbid solution was settled and separated into the layers, and the lower layer (polymer layer) was concentrated. Further, the condensed polymer was dissolved again in a mixture of 822 g of: methanol and 168 g of acetone, a dispersion and separation operation to the solution was done by using 1485 g of hexane, and the obtained lower layer (polymer layer) was concentrated. This condensed solution was dissolved in 1300 g of ethyl acetate, thereafter once subjected to neutralizing separation washing by a mixed liquid of 375 g of water and 98 g of acetic acid, and further subjected to separation washing once by 375 g of water and 75 g of pyridine, and four times by 225 g of water. Thereafter, the ethyl acetate solution of the upper layer was concentrated, dissolved in 375 g of acetone, precipitated in 20 L of water, and filtered, followed by vacuum drying at 50° C. for 40 hours, to obtain 280 g of a white polymer.
The obtained polymer was subjected to $^{13}$C, $^{1}$H-NMR, and GPC measurements, thereby obtaining the following analysis results:
Copolymerization composition ratio (molar ratio):
hydroxystyrene:4-chlorostyrene=76.8:23.2
Weight-average molecular weight (Mw)=5,200
Molecular weight distribution (Mw/Mn)=1.62
This polymer was regarded as (Polymer-8).

Comparative Synthesis Example 2

Poured into a flask of 3 L were 238.0 g of acetoxystyrene, 22.6 g of 4-chlorostyrene, and 189.4 g of indene, as well as 675 g of toluene as a solvent. This reaction vessel was cooled down to −70° C. under nitrogen atmosphere, and repetitively subjected to degasification under reduced pressure and to a nitrogen flow, three times. After temperature elevation up to a room temperature, 40.5 g of 2.2'-azobis(2,4-dimethylvaleronitrile): V-65 (produced by Wako Pure Chemical Industries, Ltd.) as a polymerization initiator was added into the mixture; after further temperature elevation up to 45° C., reaction was conducted for 20 hours; and after temperature elevation thereafter up to 55° C., reaction was further conducted for 20 hours. This reaction solution was then concentrated to ½, and precipitated in 15.0 L of a methanol solution; and the obtained white solid was filtered, followed by drying at 40° C. under reduced pressure, to obtain 311 g of a white polymer.

This polymer was again dissolved in a mixture of 488 g of methanol and 540 g of tetrahydrofuran, followed by addition of 162 g of triethylamine and 32 g of water thereinto, thereby conducting a deprotection reaction at 60° C. for 40 hours. As a fractionation step, after the reaction solution was concentrated, it was dissolved in a mixed solvent of 548 g of methanol and 112 g of acetone, and then 990 g of hexane was dropped into the solution for 10 minutes. This mixed white turbid solution was settled and separated into the layers, and the lower layer (polymer layer) was taken out and concentrated. Further, the condensed polymer was dissolved again in a mixed solvent of 548 g of methanol and 112 g of acetone, a dispersion and separation operation to the solution was done by using 990 g of hexane, and the obtained lower layer (polymer layer) was concentrated. This condensed solution was dissolved in 870 g of ethyl acetate, thereafter once subjected to neutralizing separation washing by a mixed liquid of 250 g of water and 98 g of acetic acid, and further subjected to separation washing once by 225 g of water and 75 g of pyridine, and four times by 225 g of water. Thereafter, the ethyl acetate solution of the upper layer was concentrated, dissolved in 250 g of acetone, precipitated in 15 L of water, and filtered, followed by vacuum drying at 50° C. for 40 hours, to obtain 187 g of a white polymer.

The obtained polymer was subjected to $^{13}C$, $^{1}H$-NMR, and GPC measurements, thereby obtaining the following analysis results:

Copolymerization composition ratio (molar ratio):

hydroxystyrene:4-chlorostyrene:indene=76.0:6.5:17.5

Weight-average molecular weight (Mw)=4,200

Molecular weight distribution (Mw/Mn)=1.59

This polymer was regarded as (Polymer-9).

Examples 1 to 7 and Comparative Examples 1 and 2

As shown below, a base resin, an acid generator, a basic component, a crosslinker, a surfactant and a solvent were blended in the ratio shown in Table 1 to prepare each negative resist composition of Examples and Comparative Examples.

Base resins used in Examples are Polymer-1 to Polymer-7 obtained in Synthesis Examples 1 to 7, respectively. Base resins used in Comparative Examples are Polymer-8 and Polymer-9 obtained in Comparative Synthesis Examples 1 and 2, respectively.

The acid generators of the component (B) used in following Examples and Comparative Examples are triphenylsulfonium-2,4,6-triisopropylbenzenesulfonate as PAG-1, triphenylsulfonium-2,4,6-tri-tert-butylbenzenesulfonate as PAG-2.

The organic solvents used in following Examples and Comparative Examples are propylene glytol monomethyl ether acetate (PGMEA) as solvent A, ethyl lactate (EL) as solvent B.

Further, the following compounds are amine compounds having a carboxyl group and having no active hydrogen atoms and basic compounds having no carboxyl groups, used in following Examples and Comparative Examples, respectively (Quenchers).

Quencher-1: p-diethylaminobenzoic acid

Quencher-2: p-dibutylaminobenzoic acid

Quencher-3: oxide of p-dibutylaminobenzoic acid

Quencher-4: 1-piperidinepropionic acid

Quencher-5: tris(2-(methoxymethoxy)ethyl)amine*

Quencher-6: oxide of tris(2-(methoxymethoxy)ethyl)amine*

Quencher-7: N-2-(acetoxy)ethyl-imidazole*

Here, compounds with "*" are basic components other than amine compounds having a carboxyl group and not having a hydrogen atom covalently bonded to a base-center nitrogen atom.

The crosslinker is tetramethoxymethylglycoluril, surfactant A is PF-636 (produced by Omnova Solutions Inc.).

TABLE 1

| Composition (mass part) | Ex. 1 | Ex. 2 | Ex. 3 | Ex. 4 | Ex. 5 | Ex. 6 | Ex. 7 | Com. Ex. 1 | Com. Ex. 2 |
|---|---|---|---|---|---|---|---|---|---|
| Polymer-1 | 80 | | | | | | | | |
| Polymer-2 | | 80 | | | | | | | |
| Polymer-3 | | | 80 | | | | | | |
| Polymer-4 | | | | 80 | | | | | |
| Polymer-5 | | | | | 80 | | | | |
| Polymer-6 | | | | | | 80 | | | |
| Polymer-7 | | | | | | | 80 | | |
| Polymer-8 | | | | | | | | 80 | |
| Polymer-9 | | | | | | | | | 80 |
| PAG-1 | 10 | 10 | 10 | 10 | 10 | 10 | 10 | 10 | 10 |
| Crosslinker | 8.2 | 8.2 | 8.2 | 8.2 | 8.2 | 8.2 | 8.2 | 8.2 | 8.2 |
| Quencher-1 | 0.1 | 0.1 | 0.1 | 0.1 | 0.1 | 0.1 | 0.1 | 0.1 | 0.1 |
| Quencher-4 | 0.1 | 0.1 | 0.1 | 0.1 | 0.1 | 0.1 | 0.1 | 0.1 | 0.1 |
| Surfactant A | 0.07 | 0.07 | 0.07 | 0.07 | 0.07 | 0.07 | 0.07 | 0.07 | 0.07 |
| Solvent A | 800 | 800 | 800 | 800 | 800 | 800 | 800 | 800 | 800 |
| Solvent B | 1800 | 1800 | 1800 | 1800 | 1800 | 1800 | 1800 | 1800 | 1800 |

The obtained negative resist compositions were each filtered by a filter of 0.04 μm size made of nylon resin, followed by spin coating of each resist solution at a revolution speed of 1,700 rpm onto a mask blank of 152 mm square having an outermost surface made of a chromium oxynitride film, into a coated thickness of 90 nm.

Next, each mask blank was baked for 10 minutes on a hot plate at 110° C. Measurement of a thickness of each obtained resist film was conducted by an optical measurement device NanoSpec (manufactured by Nanometrics Inc.). The measurement was conducted at 81 in-plane points of an applicable blank substrate except for an outer peripheral region within 10 mm from an outer edge to an inner extent, so as to calculate an averaged film thickness and a film thickness range.

Further, exposure was conducted by an electron beam exposure apparatus (EBM5000 Acceleration Voltage 50 keV manufactured by NuFLARE Technology, Inc.), followed by conduction of baking (FEB: post-exposure baking) at 120° C. for 10 minutes and subsequent spray development by aqueous solution of 2.38% tetramethylammonium hydroxide, thereby allowing for obtainment of negative patterns (Examples 1 to 7, and Comparative Examples 1 and 2).

The obtained resist patterns were evaluated as follows.

Assuming that an exposure dose for resolving top and bottom of a 200 nm line-and-space pattern at a resolution of 1:1 was an optimum exposure dose (sensitivity: Eop), the minimum line width of the line-and-space pattern found to be separated at this exposure dose was defined to be a resolution of the applicable evaluated resist. Further, the profile of each resolved resist pattern was observed at a cross-section of the resist by a scanning electron microscope, particularly in terms of presence or absence of undercuts at a substrate-side boundary face of resist.

Moreover, the dry etching resistance of each negative resist composition was indicated as a relative ratio of its decreased resist amount when the decreased amount of film thickness of Comparative Example 1 after etching was evaluated as 1.0, in a manner to actually conduct etching of each resist by an apparatus TE-8500S manufactured by Tokyo Electron Limited and to observe a pattern profile thereafter in a cross-section of the resist by a scanning electron microscope. Namely, smaller values imply resists which are more enhanced in etching resistance. Further, etching was conducted under the condition shown hereinafter: Preess: 250 mJ, RF power: 800 W, Gas: 1) $CHF_3$ 20 sccm, 2) $CF_4$ 20 sccm, 3) Ar 400 sccm, etching time: 2 minutes and 30 seconds Shown in Table 2 are evaluation results of resolution, pattern cross-sectional profile, and etching resistance.

TABLE 2

|  | Resolution (nm) | Cross-sectional profile | Relative etching resistance (Relative decreased amount of film thickness) | Electron beam sensitivity (μC) |
|---|---|---|---|---|
| Ex. 1 | 43 | Good | 0.8 | 13 |
| Ex. 2 | 43 | Good | 0.8 | 14 |
| Ex. 3 | 40 | Good | 0.7 | 13 |
| Ex. 4 | 40 | Good | 0.7 | 14 |
| Ex. 5 | 40 | Good | 0.7 | 15 |
| Ex. 6 | 45 | Good | 1.0 | 13 |
| Ex. 7 | 45 | Good | 1.0 | 14 |
| Com. Ex. 1 | 70 (bridge occurred) | Good | 1.0 | 35 |
| Com. Ex. 2 | 60 | Good | 0.90 | 35 |

In Comparative Example 1, a polymer comprising 4-hydroxystyrene units and 4-chiorostyrene units was used as the base resin, and it was impossible to develop a pattern of 70 nm because of a bridge.

In Comparative Example 2, a polymer comprising indene units in addition to the units used in Comparative Example 1 was used, a pattern of 60 nm was obtained. The chlorostyrene units used in Comparative Examples 1 and 2 has low crosslinking efficiency, thereby resulting in a very low sensitivity of 35 μC.

Contrary, each polymer, used in Examples 1 to 7, comprising styrene units substituted with an electron donative group have a high crosslinking efficiency, thereby resulting in the styrene unit's sensitivity of 15 μC, the methylstyrene unit's sensitivity of 14 μC and the methoxystyrene unit's sensitivity of 13 μC. In addition, all Examples, each pattern of 45 nm or less was obtained without an undercut or a bridge.

Further, each patterns obtained in Examples 1 and 2, in which an indene unit-introduced polymer was used, has a higher resolution than those in Examples 6 and 7, in which an indene unit-introduced polymer was not used. Further, each patterns obtained in Examples 3 to 5, in which an acenaphthylene unit-introduced polymer was used, has a higher resolution than them, a pattern of 40 nm could be developed without an undercut or a bridge.

The acenaphthylene unit-introduced polymer is considered to inhibit a pattern deformation in developing due to its rigidity.

In addition, as for an etching resistance, in Comparative Example 2, in which a polymer comprising indene units in addition to hydroxystyrene units and 4-chlorostyrene units used in Comparative Example 1 was used, it was shown that the decreased amount of film thickness after etching was small, and was 0.9-fold. The polymer used in Example 1 was the one that 4-chlorostyrene units of the polymer used in Example 2 were altered to 4-methoxystyrene units, and the decreased amount of film thickness after etching of Comparative Example 1 was 0.8-fold. Therefore it was proved that a chlore group decreases an etching resistance.

The polymer used in Example 3 was the one that indene units of the polymer used in Example 1 were altered to acenaphthylene units, the decreased amount of film thickness after etching in Example 3 was 0.7-fold relative to in Comparative Example 1, and therefore it was proved that an acenaphthylene unit gives an excellent etching resistance.

Examples 8 to 13

As negative resist compositions of the present invention, the negative resist compositions were each prepared by blending an amine compound having a carboxyl group and having no hydrogen atoms covalently bonded to a base-center nitrogen atom, with an amine compound having no carboxyl groups in the ratio listed in the following Table 3, and negative patterns were formed in the same manner as Examples 1 to 7. The resolutions and pattern profiles thereof were evaluated.

It was possible to form pattern lines of 40 nm without an undercut, in all Examples each having a combination of one of Quencher-1 to Quencher-4 as an amine compound having a carboxyl group and having no active hydrogen atoms, with one of Quencher-5 to Quencher-7 as an amine compound having no carboxyl groups.

TABLE 3

| Composition (mass part) | Ex. 8 | Ex. 9 | Ex. 10 | Ex. 11 | Ex. 12 | Ex. 13 |
|---|---|---|---|---|---|---|
| Polymer-4 | 80 | 80 | 80 | 80 | 80 | 80 |
| PAG-1 | 10 | 10 | 10 | 10 | 10 | 10 |
| Crosslinker | 8.2 | 8.2 | 8.2 | 8.2 | 8.2 | 8.2 |
| Quencher-1 |  |  |  | 0.1 |  |  |
| Quencher-2 |  |  |  |  | 0.1 |  |
| Quencher-3 |  |  |  |  |  | 0.1 |
| Quencher-4 | 0.1 | 0.1 | 0.1 |  |  |  |

TABLE 3-continued

| Composition (mass part) | Ex. 8 | Ex. 9 | Ex. 10 | Ex. 11 | Ex. 12 | Ex. 13 |
|---|---|---|---|---|---|---|
| Quencher-5 | 0.1 | | | 0.1 | 0.1 | 0.1 |
| Quencher-6 | | 0.1 | | | | |
| Quencher-7 | | | 0.1 | | | |
| Surfactant A | 0.07 | 0.07 | 0.07 | 0.07 | 0.07 | 0.07 |
| Solvent A | 800 | 800 | 800 | 800 | 800 | 800 |
| Solvent B | 1800 | 1800 | 1800 | 1800 | 1800 | 1800 |

Examples 14 to 19

As negative resist compositions of the present invention, the negative resist compositions were each prepared by blending an amine compound having a carboxyl group and having no hydrogen atoms covalently bonded to a base-center nitrogen atom, with an amine compound having no carboxyl groups as listed in the following Table 4, and negative patterns were formed in the same manner as Examples 1 to 7. The resolutions and pattern profiles thereof were evaluated.

Increased amounts of amine compounds resulted in deteriorated sensitivities a little but resolutions were never deteriorated. In all Examples, patterns of 40 nm could be formed without an undercut. Electron beam sensitivity is listed at the lowermost row of Table 4. Therefore, a sensitivity required in a process can be adjusted by an amount of an amine compound.

TABLE 4

| Composition (mass part) | Ex. 14 | Ex. 15 | Ex. 16 | Ex. 17 | Ex. 18 | Ex. 19 |
|---|---|---|---|---|---|---|
| Polymer-4 | 80 | 80 | 80 | 80 | 80 | 80 |
| PAG-1 | 10 | 10 | 10 | 10 | 10 | 10 |
| Crosslinker | 8.2 | 8.2 | 8.2 | 8.2 | 8.2 | 8.2 |
| Quencher-1 | 0.1 | 0.1 | 0.1 | | | |
| Quencher-4 | | | | 0.1 | 0.2 | 0.3 |
| Quencher-5 | 0.2 | | | | | |
| Quencher-6 | | 0.2 | | | | |
| Quencher-7 | | | 0.2 | | | |
| Surfactant A | 0.07 | 0.07 | 0.07 | 0.07 | 0.07 | 0.07 |
| Solvent A | 800 | 800 | 800 | 800 | 800 | 800 |
| Solvent B | 1800 | 1800 | 1800 | 1800 | 1800 | 1800 |
| Electron beam sensitivity (μC/cm²) | 16 | 18 | 17 | 8 | 14 | 20 |

Examples 20 to 26 and Comparative Example 3

As Examples and Comparative Examples, the negative resist compositions were each prepared, as listed in the following Table 5, by adopting PAG-2 instead of PAG-1 as an acid generator and negative patterns were formed in the same manner as Examples 1 to 7. The results of evaluation conducted for the resolutions and pattern profiles thereof are listed in Table 6.

In all Examples, patterns of 45 nm could be formed without an undercut or a bridge. Contrary, Comparative Example 3 has low crosslinking efficiency because of chlorostyrene units, thereby resulting in a very low sensitivity of 39 μC and a resolution of 70 nm.

In addition, PAG-2 generates an acid with a smaller diffusion than PAG-1, so that crosslinking efficiency is low and a sensitivity is lower a little (by 2 μC) compared with Examples 1 to 7 in which PAG-1 was used. A difference in the etching resistance was not observed between the kinds of these acid generators.

TABLE 5

| Composition (mass part) | Ex. 20 | Ex. 21 | Ex. 22 | Ex. 23 | Ex. 24 | Ex. 25 | Ex. 26 | Com. Ex. 3 |
|---|---|---|---|---|---|---|---|---|
| Polymer-1 | 80 | | | | | | | |
| Polymer-2 | | 80 | | | | | | |
| Polymer-3 | | | 80 | | | | | |
| Polymer-4 | | | | 80 | | | | |
| Polymer-5 | | | | | 80 | | | |
| Polymer-6 | | | | | | 80 | | |
| Polymer-7 | | | | | | | 80 | |
| Polymer-8 | | | | | | | | 80 |
| PAG-2 | 10 | 10 | 10 | 10 | 10 | 10 | 10 | 10 |
| Crosslinker | 8.2 | 8.2 | 8.2 | 8.2 | 8.2 | 8.2 | 8.2 | 8.2 |
| Quencher-1 | 0.1 | 0.1 | 0.1 | 0.1 | 0.1 | 0.1 | 0.1 | 0.1 |
| Quencher-4 | 0.1 | 0.1 | 0.1 | 0.1 | 0.1 | 0.1 | 0.1 | 0.1 |
| Surfactant A | 0.07 | 0.07 | 0.07 | 0.07 | 0.07 | 0.07 | 0.07 | 0.07 |
| Solvent A | 800 | 800 | 800 | 800 | 800 | 800 | 800 | 800 |
| Solvent B | 1800 | 1800 | 1800 | 1800 | 1800 | 1800 | 1800 | 1800 |

TABLE 6

| | Resolution (nm) | Cross-sectional profile | Relative etching resistance (Relative decreased amount of film thickness) | Electron beam sensitivity (μC) |
|---|---|---|---|---|
| Ex. 20 | 45 | Good | 0.8 | 15 |
| Ex. 21 | 45 | Good | 0.8 | 16 |
| Ex. 22 | 40 | Good | 0.7 | 15 |
| Ex. 23 | 40 | Good | 0.7 | 16 |
| Ex. 24 | 40 | Good | 0.7 | 17 |
| Ex. 25 | 45 | Good | 1.0 | 15 |
| Ex. 26 | 45 | Good | 1.0 | 16 |
| Com. Ex. 3 | 70 | Good | 1.0 | 39 |

Examples 27 to 33 and Comparative Examples 4 and 5

As Examples and Comparative Examples, the negative resist compositions were each prepared, as listed in the following Table 7, by increasing the solvent amount of Examples 1 to 7 and Comparative Examples 1 and 2 and negative patterns were formed in the same manner as Examples 1 to 7 and Comparative Examples 1 and 2. Each film thickness was 60 nm under the same coating condition due to the increase of the solvents.

The results of evaluation conducted for the resolutions and pattern profiles thereof are listed in Table 8.

Each sensitivity result was lowered by 1 μC because of thinner film thickness, but each resolution was improved. A difference in the etching resistance was not observed between the film thicknesses.

In all Examples, patterns of 40 nm or less could be formed without an undercut or a bridge. In Comparative Example 4 and 5, the result of sensitivity was very low and was 36 μC, and it was impossible to obtain a resolution of 45 nm or less because of a bridge.

TABLE 7

| Composition (mass part) | Ex. 27 | Ex. 28 | Ex. 29 | Ex. 30 | Ex. 31 | Ex. 32 | Ex. 33 | Com. Ex. 4 | Com. Ex. 5 |
|---|---|---|---|---|---|---|---|---|---|
| Polymer-1 | 80 | | | | | | | | |
| Polymer-2 | | 80 | | | | | | | |
| Polymer-3 | | | 80 | | | | | | |
| Polymer-4 | | | | 80 | | | | | |
| Polymer-5 | | | | | 80 | | | | |
| Polymer-6 | | | | | | 80 | | | |
| Polymer-7 | | | | | | | 80 | | |
| Polymer-8 | | | | | | | | 80 | |
| Polymer-9 | | | | | | | | | 80 |
| PAG-1 | 10 | 10 | 10 | 10 | 10 | 10 | 10 | 10 | 10 |
| Crosslinker | 8.2 | 8.2 | 8.2 | 8.2 | 8.2 | 8.2 | 8.2 | 8.2 | 8.2 |
| Quencher-1 | 0.1 | 0.1 | 0.1 | 0.1 | 0,1 | 0.1 | 0.1 | 0.1 | 0.1 |
| Quencher-4 | 0.1 | 0.1 | 0.1 | 0.1 | 0.1 | 0.1 | 0.1 | 0.1 | 0.1 |
| Surfactant A | 0.07 | 0.07 | 0.07 | 0.07 | 0.07 | 0.07 | 0.07 | 0.07 | 0.07 |
| Solvent A | 1100 | 1100 | 1100 | 1100 | 1100 | 1100 | 1100 | 1100 | 1100 |
| Solvent B | 2600 | 2600 | 2600 | 2600 | 2600 | 2600 | 2600 | 2600 | 2600 |

TABLE 8

| | Resolution (nm) | Cross-sectional profile | Relative etching resistance (Relative decreased amount of film thickness) | Electron beam sensitivity (μC) |
|---|---|---|---|---|
| Ex. 27 | 40 | Good | 0.8 | 14 |
| Ex. 28 | 40 | Good | 0.8 | 15 |
| Ex. 29 | 40 | Good | 0.7 | 14 |
| Ex. 30 | 35 | Good | 0.7 | 15 |
| Ex. 31 | 35 | Good | 0.7 | 16 |
| Ex. 32 | 40 | Good | 1.0 | 14 |
| Ex. 33 | 40 | Good | 1.0 | 15 |
| Com. Ex. 4 | 65 | Good | 1.0 | 36 |
| Com. Ex. 5 | 55 | Good | 0.90 | 36 |

The present invention is not limited to the above embodiments. The above embodiments are merely illustrative, and whatever having the substantially same configurations as the technical concept recited in the claims of the present application and exhibiting the same functions and effects are embraced within the technical scope of the present invention.

What is claimed is:
1. A negative resist composition comprising at least:
(A) a base resin that is alkaline-soluble and is made alkaline-insoluble by action of an acid, and/or a combination of a base resin that is alkaline-soluble and is made alkaline-insoluble by reaction with a crosslinker by action of an acid, with a crosslinker;
(B) an acid generator; and
(C) a compound containing a nitrogen atom as a basic component,
wherein the base resin contains at least repeating units represented by the following general formula (1), general formula (2), and general formula (4) and has a weight average molecular weight of 1,000 to 10,000,

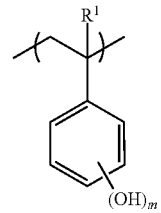 (1)

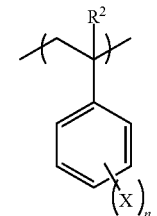 (2)

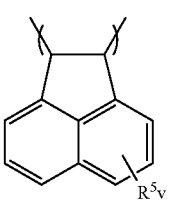 (4)

wherein each $R^1$ and $R^2$ independently represents a hydrogen atom or a methyl group, X represents one or more groups selected from a linear, a branched, or a cyclic alkyl group having 1 to 10 carbon atoms, an alkoxy group having 1 to 10 carbon atoms and a thioalkyl group having 1 to 10 carbon atoms, m and n represent an integer of 1 to 4, $R^5$ represents a hydrogen atom, a hydroxyl group, an alkyl group having 1 to 10 carbon atoms or an alkoxy group having 1 to 10 carbon atoms, and v represents an integer of 0 to 5, and the compound containing a nitrogen atom as a basic component contains at least one or more kinds of amine compounds having a carboxyl group and not having a hydrogen atom covalently bonded to a base-center nitrogen atom, wherein the base-center nitrogen atom is not included in an aromatic ring.

2. The negative resist composition according to claim 1, wherein X is one or more groups selected from a methyl group, an ethyl group, a methoxy group and an ethoxy group.

3. The negative resist composition according to claim 1, wherein the base resin has a weight average molecular weight of 1,000 to 5,000.

4. The negative resist composition according to claim 2, wherein the base resin has a weight average molecular weight of 1,000 to 5,000.

5. The negative resist composition according to claim 1, wherein the acid generator of the component (B) contains at least one or more kinds of the compounds represented by the following general formula (5),

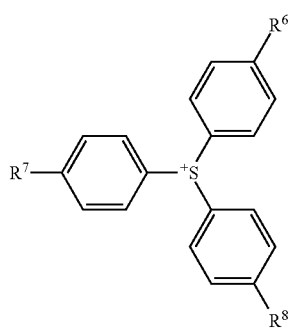

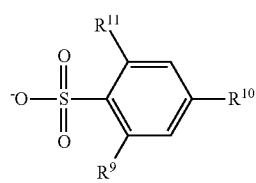

wherein $R^6$, $R^7$, and $R^8$ represent a hydrogen atom, or a linear or a branched alkyl group having 1 to 4 carbon atoms, wherein they may be the same or different; and $R^9$, $R^{10}$, and $R^{11}$ represent a linear or a branched alkyl group having 3 to 10 carbon atoms, wherein they may be the same or different.

6. The negative resist composition according to claim 2, wherein the acid generator of the component (B) contains at least one or more kinds of the compounds represented by the following general formula (5),

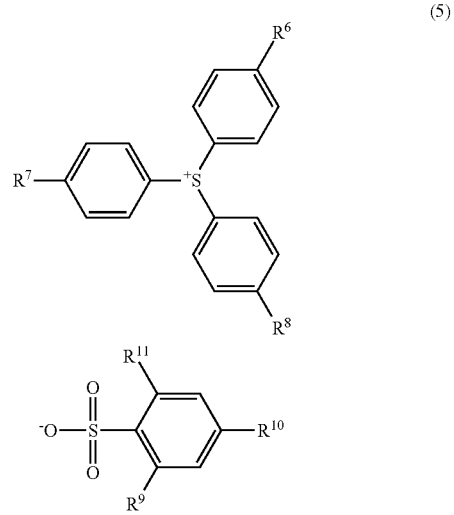

wherein $R^6$, $R^7$, and $R^8$ represent a hydrogen atom, or a linear or a branched alkyl group having 1 to 4 carbon atoms, wherein they may be the same or different; and $R^9$, $R^{10}$, and $R^{11}$ represent a linear or a branched alkyl group having 3 to 10 carbon atoms, wherein they may be the same or different.

7. The negative resist composition according to claim 3, wherein the acid generator of the component (B) contains at least one or more kinds of the compounds represented by the following general formula (5),

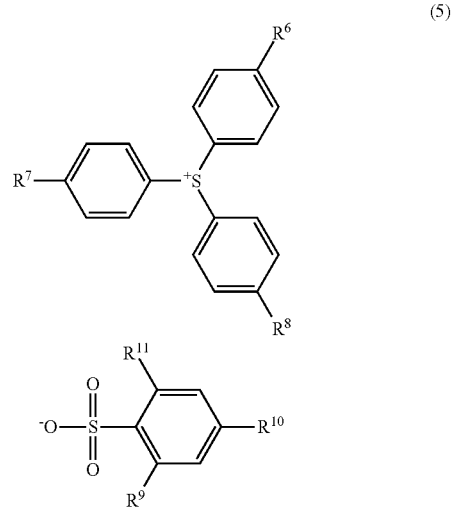

wherein $R^6$, $R^7$, and $R^8$ represent a hydrogen atom, or a linear or a branched alkyl group having 1 to 4 carbon atoms, wherein they may be the same or different; and $R^9$, $R^{10}$, and $R^{11}$ represent a linear or a branched alkyl group having 3 to 10 carbon atoms, wherein they may be the same or different.

8. The negative resist composition according to claim 4, wherein the acid generator of the component (B) contains at least one or more kinds of the compounds represented by the following general formula (5), (5)

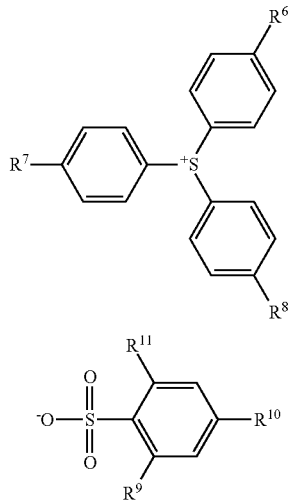

(7)

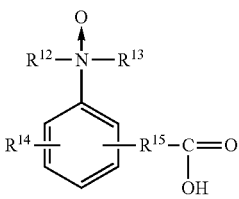

wherein $R^{12}$, $R^{13}$, $R^{14}$, and $R^{15}$ represent the same meaning as before;

(8)

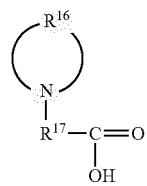

wherein $R^6$, $R^7$, and $R^8$ represent a hydrogen atom, or a linear or a branched alkyl group having 1 to 4 carbon atoms, wherein they may be the same or different; and $R^9$, $R^{10}$, and $R^{11}$ represent a linear or a branched alkyl group having 3 to 10 carbon atoms, wherein they may be the same or different.

9. The negative resist composition according to claim 1, wherein the amine compound having a carboxyl group and not having a hydrogen atom covalently bonded to a base-center nitrogen atom contains one or more kinds of the compounds represented by the following general formulae (6) to (8), wherein $R^{16}$ represents a linear or a branched substitutable alkylene group having 2 to 20 carbon atoms which may contain one or a plurality of a carbonyl group, an ether group, an ester group, and a sulfide between the carbon-carbon bond of the alkylene group; and $R^{17}$ represents a linear, a branched, or a cyclic alkylene group having 1 to 20 carbon atoms, or an arylene group having 6 to 20 carbon atoms.

10. The negative resist composition according to claim 8, wherein the amine compound having a carboxyl group and not having a hydrogen atom covalently bonded to a base-center nitrogen atom contains one or more kinds of the compounds represented by the following general formulae (6) to (8), (6)

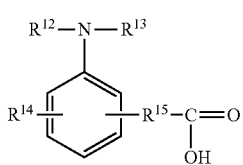

(6)

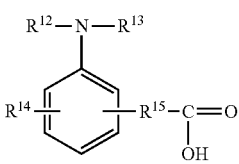

wherein $R^{12}$ and $R^{13}$ each represents a linear, a branched, or a cyclic alkyl group having 1 to 20 carbon atoms, an aryl group having 6 to 20 carbon atoms, an aralkyl group having 7 to 20 carbon atoms, a hydroxy alkyl group having 2 to 10 carbon atoms, an alkoxy alkyl group having 2 to 10 carbon atoms, an acyloxy alkyl group having 3 to 10 carbon atoms, or an alkyl thioalkyl group having 1 to 10 carbon atoms; $R^{12}$ and $R^{13}$ may be bonded to form a cyclic structure; $R^{14}$ represents a hydrogen atom, a linear, a branched, or a cyclic alkyl group having 1 to 20 carbon atoms, an aryl group having 6 to 20 carbon atoms, an aralkyl group having 7 to 20 carbon atoms, a hydroxy alkyl group having 2 to 10 carbon atoms, an alkoxy alkyl group having 2 to 10 carbon atoms, an acyloxy alkyl group having 3 to 10 carbon atoms, an alkyl thioalkyl group having 1 to 10 carbon atoms, or a halogen group; $R^{15}$ represents a single bond, a linear, a branched, or a cyclic alkylene group having 1 to 20 carbon atoms, or an arylene group having 6 to 20 carbon atoms;

wherein $R^{12}$ and $R^{13}$ each represents a linear, a branched, or a cyclic alkyl group having 1 to 20 carbon atoms, an aryl group having 6 to 20 carbon atoms, an aralkyl group having 7 to 20 carbon atoms, a hydroxy alkyl group having 2 to 10 carbon atoms, an alkoxy alkyl group having 2 to 10 carbon atoms, an acyloxy alkyl group having 3 to 10 carbon atoms, or an alkyl thioalkyl group having 1 to 10 carbon atoms; $R^{12}$ and $R^{13}$ may be bonded to form a cyclic structure; $R^{14}$ represents a hydrogen atom, a linear, a branched, or a cyclic alkyl group having 1 to 20 carbon atoms, an aryl group having 6 to 20 carbon atoms, an aralkyl group having 7 to 20 carbon atoms, a hydroxy alkyl group having 2 to 10 carbon atoms, an alkoxy alkyl group having 2 to 10 carbon atoms, an acyloxy alkyl group having 3 to 10 carbon atoms, an alkyl thioalkyl group having 1 to 10 carbon atoms, or a halogen group; $R^{15}$ represents a single bond, a linear, a branched, or a cyclic alkylene group having 1 to 20 carbon atoms, or an arylene group having 6 to 20 carbon atoms;

(7)

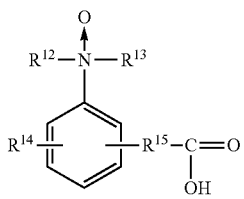

wherein $R^{12}$, $R^{13}$, $R^{14}$, and $R^{15}$ represent the same meaning as before;

(8)

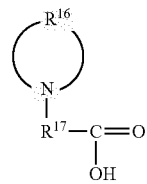

wherein $R^{16}$ represents a linear or a branched substitutable alkylene group having 2 to 20 carbon atoms which may contain one or a plurality of a carbonyl group, an ether group, an ester group, and a sulfide between the carbon-carbon bond of the alkylene group; and $R^{17}$ represents a linear, a branched, or a cyclic alkylene group having 1 to 20 carbon atoms, or an arylene group having 6 to 20 carbon atoms.

11. The negative resist composition according to claim 1, wherein the basic component of the component (C) further contains at least one or more kinds selected from amine compounds represented by the following general formula (9) and general formula (10), (9)

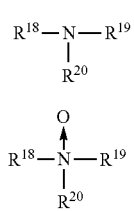

(10)

wherein $R^{18}$, $R^{19}$, and $R^{20}$ each represents a hydrogen atom, a linear, a branched, or a cyclic alkyl group having 1 to 20 carbon atoms, an aryl group having 6 to 20 carbon atoms, an aralkyl group having 7 to 20 carbon atoms, a hydroxy alkyl group having 2 to 10 carbon atoms, an alkoxy alkyl group having 2 to 10 carbon atoms, an acyloxy alkyl group having 3 to 10 carbon atoms, or an alkyl thioalkyl group having 1 to 10 carbon atoms; two of $R^{18}$, $R^{19}$, and $R^{20}$ may be bonded to form a cyclic structure or an aromatic ring.

12. The negative resist composition according to claim 10, wherein the basic component of the component (C) further contains at least one or more kinds selected from amine compounds represented by the following general formula (9) and general formula (10), (9)

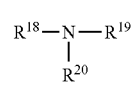

(10)

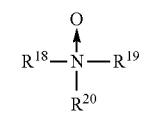

wherein $R^{18}$, $R^{19}$, and $R^{20}$ each represents a hydrogen atom, a linear, a branched, or a cyclic alkyl group having 1 to 20 carbon atoms, an aryl group having 6 to 20 carbon atoms, an aralkyl group having 7 to 20 carbon atoms, a hydroxy alkyl group having 2 to 10 carbon atoms, an alkoxy alkyl group having 2 to 10 carbon atoms, an acyloxy alkyl group having 3 to 10 carbon atoms, or an alkyl thioalkyl group having 1 to 10 carbon atoms; two of $R^{18}$, $R^{19}$, and $R^{20}$ may be bonded to form a cyclic structure or an aromatic ring.

13. A resist patterning process, the resist patterning process by a lithography, wherein, at least, a resist film is formed over a substrate to be processed by using the negative resist composition according to claim 1, and the resist film is exposed to a high energy beam and then developed by an aqueous alkaline developer to obtain a resist pattern.

14. A resist patterning process, the resist patterning process by a lithography, wherein, at least, a resist film is formed over a substrate to be processed by using the negative resist composition according to claim 12, and the resist film is exposed to a high energy beam and then developed by an aqueous alkaline developer to obtain a resist pattern.

15. The resist patterning process according to claim 13, wherein a film thickness of the resist film is 10 to 100 nm.

16. The resist patterning process according to claim 14, wherein a film thickness of the resist film is 10 to 100 nm.

17. The resist patterning process according to claim 13, wherein a photomask blank is used as the substrate to be processed.

18. The resist patterning process according to claim 16, wherein a photomask blank is used as the substrate to be processed.

19. The resist patterning process according to claim 17, wherein a photomask blank having an outermost surface made of a chromium compound film is used as the photomask blank.

20. The resist patterning process according to claim 18, wherein a photomask blank having an outermost surface made of a chromium compound film is used as the photomask blank.

* * * * *